United States Patent
Dhillon et al.

(10) Patent No.: US 9,255,009 B2
(45) Date of Patent: Feb. 9, 2016

(54) DIAMOND MATERIAL

(75) Inventors: Harpreet Kaur Dhillon, Berkshire (GB); Sarah Louise Geoghegan, Berkshire (GB); Daniel James Twitchen, Berkshire (GB)

(73) Assignee: Element Six Technologies Limited, Didcot (GB)

( * ) Notice: Subject to any disclaimer, the term of this patent is extended or adjusted under 35 U.S.C. 154(b) by 669 days.

(21) Appl. No.: 12/823,492

(22) Filed: Jun. 25, 2010

(65) Prior Publication Data

US 2010/0329961 A1    Dec. 30, 2010

Related U.S. Application Data

(60) Provisional application No. 61/220,663, filed on Jun. 26, 2009, provisional application No. 61/247,735, filed on Oct. 1, 2009, provisional application No. 61/310,639, filed on Mar. 4, 2010, provisional application No. 61/320,023, filed on Apr. 1, 2010, provisional application No. 61/332,878, filed on May 10, 2010.

(51) Int. Cl.
| | |
|---|---|
| C01B 31/06 | (2006.01) |
| A44C 17/00 | (2006.01) |
| A44C 17/02 | (2006.01) |
| C23C 16/27 | (2006.01) |
| C23C 16/56 | (2006.01) |
| C30B 25/10 | (2006.01) |
| C30B 29/04 | (2006.01) |
| C30B 31/20 | (2006.01) |

(52) U.S. Cl.
CPC .............. *C01B 31/065* (2013.01); *A44C 17/00* (2013.01); *A44C 17/02* (2013.01); *C23C 16/27* (2013.01); *C23C 16/277* (2013.01); *C23C 16/278* (2013.01); *C23C 16/56* (2013.01); *C30B 25/105* (2013.01); *C30B 29/04* (2013.01); *C30B 31/20* (2013.01); *A44C 17/008* (2013.01)

(58) Field of Classification Search
None
See application file for complete search history.

(56) References Cited

U.S. PATENT DOCUMENTS

| | | |
|---|---|---|
| 2,945,793 A | 7/1960 | Dugdale |
| 4,959,201 A | 9/1990 | Satoh et al. |
| 5,451,430 A | 9/1995 | Anthony et al. |

(Continued)

FOREIGN PATENT DOCUMENTS

| | | |
|---|---|---|
| EP | 0 275 063 A2 | 11/1988 |
| EP | 0 316 856 A1 | 11/1988 |

(Continued)

OTHER PUBLICATIONS

Stesmans et al.; Chemical Vapour Deposition Diamond Studied by Optical and Electron Spin Resonance Techniques; Journal Physics; Condensation Matter; 14, R467-R499; 2002.*

(Continued)

*Primary Examiner* — Guinever S Gregorio
(74) *Attorney, Agent, or Firm* — Dean W. Russell; Clark F. Weight; Kilpatrick Townsend & Stockton LLP

(57) ABSTRACT

Starting from a diamond material which shows a difference in its absorption characteristics after exposure to radiation with an energy of at least 5.5 eV (typically UV radiation) and thermal treatment at 798K, controlled irradiation is applied so as to introduce defects in the diamond material. After the controlled irradiation the difference in the absorption characteristics after exposure to radiation with an energy of at least 5.5 eV and thermal treatment at 798K is reduced.

17 Claims, 7 Drawing Sheets

(56) References Cited

U.S. PATENT DOCUMENTS

| | | | |
|---|---|---|---|
| 5,672,395 | A | 9/1997 | Anthony et al. |
| 6,030,595 | A | 2/2000 | Sumiya et al. |
| 7,122,837 | B2 | 10/2006 | Linares et al. |
| 7,172,655 | B2 | 2/2007 | Twitchen et al. |
| 7,964,280 | B2 | 6/2011 | Williams et al. |
| 2002/0172638 | A1 | 11/2002 | Vagarali et al. |
| 2004/0175499 | A1 | 9/2004 | Twitchen et al. |
| 2004/0194690 | A1 | 10/2004 | Twitchen et al. |
| 2004/0229464 | A1 | 11/2004 | Godfried et al. |
| 2005/0181131 | A1 | 8/2005 | Linares et al. |
| 2006/0292302 | A1 | 12/2006 | Chodelka et al. |
| 2007/0053823 | A1 | 3/2007 | Vins |
| 2007/0092647 | A1 | 4/2007 | Scarsbrook et al. |
| 2008/0241049 | A1 | 10/2008 | Hemley et al. |
| 2010/0028556 | A1 | 2/2010 | Linares et al. |
| 2010/0104494 | A1 | 4/2010 | Meng et al. |

FOREIGN PATENT DOCUMENTS

| | | |
|---|---|---|
| EP | 0 615 954 A1 | 8/1994 |
| EP | 0 671 482 A1 | 3/1995 |
| EP | 1 990 313 A1 | 10/2007 |
| GB | 2 430 194 A | 5/2003 |
| GB | 743584 A | 3/2007 |
| JP | 2 571 797 B2 | 11/1987 |
| JP | 62296875 | 11/1987 |
| JP | 2 184 600 A | 1/1989 |
| JP | 64 020689 | 1/1989 |
| JP | 01 131014 A | 5/1989 |
| JP | 01-138112 A | 5/1989 |
| JP | 2 000 385 | 1/1990 |
| JP | 06 263418 | 9/1994 |
| JP | 2005 512929 A | 5/2005 |
| JP | 2005 538018 A | 12/2005 |
| JP | 2006 507204 A | 3/2006 |
| JP | 2010 526746 A | 8/2010 |
| KR | 10-2008-0089734 A | 10/2008 |
| RU | 2145365 C1 | 2/2000 |
| WO | 99 67171 | 12/1999 |
| WO | 01 96633 A1 | 12/2001 |
| WO | 01 96634 A1 | 12/2001 |
| WO | 03 014427 A1 | 2/2003 |
| WO | 03 052177 A1 | 6/2003 |
| WO | 2004 022821 A1 | 3/2004 |
| WO | 2004 046427 A1 | 3/2004 |
| WO | 2007 009037 A1 | 1/2007 |
| WO | 2010 010344 A1 | 1/2010 |
| WO | 2010 010352 A1 | 1/2010 |

OTHER PUBLICATIONS

Kennedy et al.; Long Coherence Times at 300 K for Nitrogen-Vacancy Center Spins in Diamond Grown by Chemical Vapor Deposition; Appl. Phys. Lett.; vol. 83, 4190; 2003.*

Hainschwang; Classification and Color Origin of Brown Diamonds; Nov. 2003.*

Fritsch et al.; Gems & Geology; 1988.*

De Weerdt et al, "Defects in coloured natural diamonds," Diamond and Related Materials, 10, 2001, pp. 474-479.

G. Davies, "Current problems in diamond: towards a quantitative understanding," Physica B. 273-274, 1999, pp. 15-23.

King, et al., "Color grading of colored diamonds in the GIA gem trade laboratory," Gems & Gemology, vol. 30, No. 4, 1994, pp. 220-242.

P. Von Fritz, "Uber Brechungsindizes und Absorptionskonstanten des Diamanten zwischen 644 und 288 mu1). ," Z. Phys. 15, 1923, pp. 358-368.

Howarth, et al., "Generalization of the lineshape useful in magnetic resonance spectroscopy," J. Magn. Res., 161, 2003, pp. 215-221.

Hyde, et al., "Pseudo Field Modulation in EPR Spectroscopy," Appl. Magn. Reson., 1, 1990, pp. 483-496.

Wyszecki, et al., "Color Science Concepts and Methods, Quantitative Data and Formulas," New York; London-Sydney, 1967, pp. 9, 242-251.

Commission Internationale de L'Eclairage, "Colorimetry," 1986, pp. 27-33.

Pagel-Theisen et al., "Diamond Grading ABC the Manual," Rubin & Son, Belgium, 9th Edition, 2001, pp. 64-67.

Bradlow et al., "Asymmetry of the GR1 line in type IIA diamond," Solid State Communications, vol. 38, 1981, pp. 247-249.

Collins et al., "The annealing of radiation damage in De Beers colourless CVD diamond," Diamond and Related Materials, vol. 3, No. 4-6,1994, pp. 932-935.

Fritsch, et al., "Thermochromic and photochromic behavior of "chameleon" diamonds," Diamond and Related Materials, vol. 16, 2007, pp. 401-408.

Kennedy, et al., "Long coherence times at 300 K for nitrogen-vacancy center spins in diamond grown by chemical vapor deposition," Applied Physics Letters, vol. 83, No. 20, 2003, pp. 4190-4192.

Nelder, et al., "A simplex method for function minimization," The Computer Journal, 7, 1965, pp. 308-313.

Walderman et al., "Creating diamond color centers for quantum optical applications," Diamond and Related Materials, vol. 16, 2007, pp. 1887-1895.

J. Walker, "Optical absorption and luminescence in diamond," Rep. Prog. Phys 1979, 42, pp. 1605-1659.

Wang, "CVD Grown Pink Diamonds," GIA Laboratories, Apr. 2009, pp. 1-3.

PCT Search Report for PCT/EP2010/059078 dated Sep. 27, 2010.

PCT Search Report for PCT/EP2010/059080 dated Aug. 26, 2010.

PCT Search Report for PCT/EP2010/059081 dated Sep. 22, 2010.

PCT Search Report for PCT/EP2010/059084 dated Sep. 20, 2010.

McLaren, et al., The Derivation of Hue-Difference Terms from CIELAB Coordinates, Color Research and Application, vol. 6(2), pp. 75-77, 1981.

Search Report for GB1005573.9 dated Jul. 29, 2010.

Search Report for GB0911075.0 dated Oct. 29, 2009.

Search Report for GB1003613.5 dated Jun. 30, 2010.

* cited by examiner

DIAMOND MATERIAL

This invention relates to changes to the absorption characteristics of some types of nitrogen-containing diamond material that may occur when that diamond material is exposed to certain conditions. In particular the invention relates to a method involving controlled irradiation of that diamond material to minimize the changes. Preferred methods according to the invention relate to controlled irradiation of diamond material made by chemical vapor deposition (so-called CVD synthetic diamond material). The invention also relates to diamond material per se. Preferred embodiments of diamond material according to the invention relate to CVD synthetic diamond material which has been subjected to controlled irradiation.

A particular type of rare fancy-colored, naturally occurring diamond, known as chameleon diamond, is known, which shows changes to its absorption characteristics under certain conditions. Being rare and deemed valuable, there are not known to be any reports of non-reversible treatments on these diamonds.

The term "fancy-colored diamond" is a well-established gem trade classification of stronger and more unusual colors in diamond material.

Pink type IIa natural diamonds also form another important class of diamonds that exhibit color changes. These have been shown to change color from pink to brown upon ultraviolet (UV) illumination as described by de Weerdt and van Royen (Diamond and Related Materials, 10 (2001), 474-479). The pink color is a result of a broad optical absorption feature at 550 nm that is bleached by ultraviolet radiation and also diminishes on cooling.

In the manufacture of synthetic diamond material, in particular CVD synthetic diamond material, it is known to dope the diamond material by the addition of low concentrations of nitrogen to the gases fed into the synthesis chamber during the CVD process. It is known in the art that this can be advantageous, the nitrogen increasing the growth rate of the CVD synthetic diamond material. It is also known that the presence of the low concentrations of nitrogen in the CVD growth environment can affect the nature and concentration of the defects that are incorporated as the material grows.

As mentioned above, this invention relates to controlled irradiation of diamond material to minimize changes to the absorption characteristics of some types of nitrogen-containing diamond material that may occur when that diamond material is exposed to certain conditions. Irradiation of diamond material is known in the prior art. For example, EP 0615954 and EP 0316856 describe irradiation of synthetic diamond material with an electron bean or a neutron beam to form lattice defects in the crystal. Thereafter the diamond crystal is annealed in a prescribed temperature range, so that nitrogen atoms are bonded with the lattice defects to form color centers, such as that comprising a substitutional nitrogen atom adjacent to a vacancy, referred to as an "[N-V] color centre" or just "N-V", which can give the diamond material a desirable color, such as purple or red/pink, i.e. they introduce a desired fancy color into the diamond material. Similarly "Optical Absorption and Luminescence" by John Walker in "Reports on Progress in Physics", Volume 42, 1979, describes the steps of forming lattice defects in crystals by electron beam irradiation, and if necessary annealing to cause the lattice defects to combine with nitrogen atoms contained in the crystals. In the prior art the whole purpose of the irradiation and annealing steps is to produce so-called color centers, that is to introduce color into the diamond material. The irradiated and annealed diamond material of EP 0615954A and EP 0316856A contains so-called N-V defects as identified by significant absorptions at about 570 nm.

Similarly "CVD Grown Pink Diamonds" by Wuyi Wang, of GIA Laboratories, published 30 Apr. 2009 on www.gia.edu/research-resources describes CVD synthetic diamond material where some significant amount of the nitrogen present is in the form of N-V centers which strongly absorb yellow and orange light, thus creating a pink to red color. These diamond materials, like those described in the two EP publications (EP 0615954 and EP 0316856) contain N-V centers as evidenced by inter alia strong absorptions at about 570 nm.

We have observed that some nitrogen doped synthetic diamond material, particularly some nitrogen doped synthetic diamond material when made by chemical vapor deposition (CVD synthetic diamond material), also show changes to their absorption characteristics, which can be observed as a color change, under certain conditions. Thus, like the chameleon diamonds, we have noticed that the color of such synthetic diamond material may vary across a color range, the color being unstable across this color range, and the observed color at any particular time depending on the recent history of the diamond material. For example exposure to radiation, particularly to radiation with an energy greater than 2.0 eV, for example exposure to ultraviolet radiation, tends to change the diamond material to a lower grade color, which is generally considered less desirable, whereas thermal treatment at elevated temperatures tends to change the diamond material to a higher grade color, which is generally considered more desirable. Low and high grade colors are defined later in the specification. Since for most applications the usual state for diamond material is one in which it is exposed to radiation in the form of light, the usual color of the diamond material tends towards the lower, less desirable color grades of their unstable color range. In this specification we shall refer to this usual color for the diamond material, i.e. the color of the diamond material when it is exposed to radiation, or has recently, been exposed to radiation, particularly to radiation with an energy greater than 2.0 eV, as its "equilibrium color", and the usual state of diamond material, i.e. the state where it is exposed to radiation, or has recently been exposed to radiation, as its "equilibrium state" or "equilibrium condition".

As mentioned above, it is known that the presence of the low concentrations of nitrogen in a CVD growth environment can affect the nature and concentration of the defects that are incorporated in a CVD synthetic diamond material as the diamond material grows.

Electron paramagnetic resonance (EPR) and optical absorption spectroscopy have been used to study the nature of defects introduced into the diamond material as a direct consequence of the CVD growth process in which low concentrations of nitrogen are introduced. The presence of the nitrogen in the grown CVD synthetic diamond material can be evidenced by looking at absorption spectra for the grown diamond material, and while the exact nature of all the defects in this diamond material are not fully understood, analysis of these spectra gives some indication of the relative proportions of different types of defect present in the grown CVD synthetic diamond material as a result of the presence of low concentrations of nitrogen during the growth process. A typical spectrum for grown CVD synthetic diamond material grown with nitrogen added to the synthesis environment shows a peak at about 270 nm, which is generated by the presence of neutral single substitutional nitrogen (SSN) atoms in the diamond lattice. Additionally peaks have been observed at about 350 nm and approximately 510 nm corresponding to other defects characteristic and unique to CVD synthetic diamond material, and furthermore a so-called "ramp", that is a rising background of the form $c \times \lambda^{-3}$ has been observed, where c is a constant and $\lambda$ is the wavelength. The combination of these features (SSN, 350 nm peak, 510 nm peak and ramp) affect the color in the visible part of the electromagnetic spectrum (which is generally considered to cover the wavelength range 380 nm to 750 nm), and are believed to be responsible for the brown color usually seen in nitrogen doped CVD synthetic diamond material.

In practice it has been found that the precise width and position in the spectrum of these characteristic absorption bands can vary. The position of peak maxima is most easily ascertained by using the second differential of the spectrum. It has been found that absorption spectra can generally be deconstructed into a number of approximate components, and it is useful to carry out this deconstruction, since when the well understood components are subtracted from any recorded spectrum, then the contribution of other, less well understood, components can more easily be seen. For example, it is known to subtract the spectral component of standard synthetic diamond material from any observed spectrum. In the present case, for diamond material referred to in the present invention, we have used the spectral decomposition set out in the numbered paragraphs below and shown in FIG. 1. For ease of comparison the following limits are measured from 0 cm$^{-1}$ on the individual spectral component, with the spectrum being made to be 0 at 800 nm.

1) Single substitutional nitrogen component with an absorption coefficient at 270 nm that is generally within the range 0.05 cm$^{-1}$ and 20 cm$^{-1}$ and an absorption coefficient at 425 nm that generally lies between 0.04 cm$^{-1}$ and 1 cm$^{-1}$.
2) An absorption band centered at 3.54 eV (350 nm)±0.2 eV with a full width at half maximum (FWHM) of approximately 1 eV and a maximum contribution to the absorption spectrum generally between 0.05 cm$^{-1}$ and 8 cm$^{-1}$ at its centre.
3) An absorption band centered at 2.43 eV (510 nm)±0.4 eV with a FWHM of approximately 1 eV and a maximum contribution to the absorption spectrum generally between 0.02 cm$^{-1}$ and 4 cm$^{-1}$ at its centre.
4) A small residual wavelength dependent component of the measured absorption coefficient (in cm$^{-1}$) that is found to have a wavelength dependence of the following approximate form: $c \times (\text{wavelength}, \lambda, \text{in } \mu m)^{-3}$ where $c<0.2$ such that the contribution of this component at 510 nm is generally less than 1.5 cm$^{-1}$.

FIG. 1 shows the absorption spectrum of a typical CVD synthetic diamond layer (curve B) which has been removed from its growth substrate, and the components into which it can be deconvoluted. The first step in the spectral decomposition is the subtraction of the spectrum of a type Ib high pressure high temperature (HPHT) synthetic diamond material (curve A), scaled so that the residual shows no 270 nm feature. The residual spectrum is then be deconvoluted into a $c \times \lambda^{-3}$ component (curve C) and two overlapping bands, one centered at 350 nm and the other centered at 510 nm of the kind described above in numbered paragraphs (2) and (3) above. The two overlapping bands are shown as curve D in FIG. 1.

It is known that the form of UV/visible optical absorption spectra of CVD synthetic diamond material grown using a range of different processes can be specified by sums of the components described above, with different weighting factors for the components in different cases. For the purposes of specifying the shape of the spectrum the contributions of the different components are given in the following ways.

270 nm: The peak 270 nm absorption coefficient of the type Ib component is measured from a sloping baseline connecting the type Ib spectrum either side of the 270 nm feature that extends over the approximate range from 235 nm to 325 nm.

350 nm band: The peak absorption coefficient contribution of this band.

510 nm band: The peak absorption coefficient contribution of this band.

Ramp: The contribution of the $c \times \lambda^{-3}$ component to the absorption coefficient at 510 nm.

In the present specification, for all quoted absorption coefficients, the absorption coefficients have been measured by normalizing the spectra so that they start at 0 cm$^{-1}$ at 800 nm.

The method according to the present invention is particularly applicable to synthetic diamond material, more particularly to CVD synthetic diamond material.

As noted above, diamond materials that exhibit a pronounced amount of color are known as "fancy" colored diamonds in the field. Other diamond materials that do not show such pronounced color may be graded using the Gemological Institute of America (GIA) scale.

That scale grades diamond materials alphabetically from D to Z. The GIA scale is well known. D represents the highest grade and most colorless diamond material on the GIA scale, and Z represents the lowest grade on the GIA scale, a diamond material of grade Z appearing light yellow to the naked eye. Higher grade diamond materials (those on the GIA scale nearer to grade D) are generally considered more desirable than lower grade diamond materials (those nearer to grade Z), both in the gem trade and for industrial applications. When a diamond material's color is more intense that the Z grading it enters the realm of "fancy" diamond of which chameleon diamonds are a sub set.

There are three visual attributes to color, these being hue, lightness and saturation. These terms are well understood by the person skilled in the art. Briefly: hue is the attribute of color that allows it to be classified as red, green, blue, yellow, black or white, or and intermediated thereof; lightness is the attribute of color that is defined by the degree of similarity with a neutral achromatic scale starting with white and progressing through grey to black; saturation is the attribute of color that is defined by the degree of difference from an achromatic color of the same lightness. Saturation is also a descriptive term corresponding to the strength of the color. A system for quantifying color, known as the "CIE L*a*b* color space" or more simply "CIELAB", exists which defines the saturation by a parameter known as C*. Where the color of a diamond material falls within the GIA scale, the correlation between C* values and GIA grades respectively is 0=D, 0.5=E, 1.0=F, 1.5=G, 2.0=H etc for a round brilliant cut (RBC) diamond and where the saturation (C*) is determined from the absorbance spectrum measured along the axis of the stone through the complete depth of the material. In practice, all measurements on the GIA scale in this document are for an equivalent 0.5 ct round brilliant cut gemstone. C* values are also applicable to fancy colored diamonds.

Our invention is applicable to all colors of diamond materials, including diamond materials whose color falls only within the GIA scale of D to Z, and fancy diamonds whose color may be outside the GIA scale of D to Z.

The perceived color of an object depends on the transmittance/absorbance spectrum of the object, the spectral power distribution of the illumination source and the response curves of the observer's eyes. The CIELAB chromaticity coordinates quoted in this patent application have been derived in the way described below. Using a standard D65 illumination spectrum and standard (red, green and blue) response curves of the eye (G. Wyszecki and W. S. Stiles, John Wiley, New York-London-Sydney, 1967), CIE L*a*b* chromaticity coordinates of a parallel-sided plate of diamond material have been derived from its transmittance spectrum using the relationships below, between 350 nm and 800 nm with a data interval of 1 nm:

$S_\lambda$=transmittance at wavelength $\lambda$
$L_\lambda$=spectral power distribution of the illumination
$x_\lambda$=red response function of the eye
$y_\lambda$=green response function of the eye
$z_\lambda$=blue response function of the eye $X=\Sigma_\lambda[S_\lambda x_\lambda L_\lambda]/Y_0$ $Y=\Sigma_\lambda[S_\lambda y_\lambda L_\lambda]/Y_0$ $Z=\Sigma_\lambda[S_\lambda z_\lambda L_\lambda]/Y_0$ Where $Y_0=\Sigma_\lambda y_\lambda L_\lambda$ $L^*=116(Y/Y_0)^{1/3}-16=$Lightness (for $Y/Y_0>0.008856$)

$a^*=500[(X/X_0)^{1/3}-(Y/Y_0)^{1/3}]$ (for $X/X_0>0.008856$, $Y/Y_0>0.008856$)

$b^*=200[(Y/Y_0)^{1/3}-(Z/Z_0)^{1/3}]$ (for $Z/Z_0>0.008856$)

$C^*=(a^{*2}+b^{*2})^{1/2}=$saturation $h_{ab}=\arctan(b^*/a^*)=$hue angle

Modified versions of these equations must be used outside the limits of $Y/Y_0$, $X/X_0$ and $Z/Z_0$. The modified versions are given in a technical report prepared by the Commission Internationale de L'Eclairage (Colorimetry (1986)).

It is possible to predict how the a*b* coordinates of diamond material with a given absorption coefficient spectrum will change as the optical path length is varied. In order to do this, the reflection loss must first be subtracted from the measured absorbance spectrum. The absorbance is then scaled to allow for a different path length and then the reflection loss is added back on. The absorbance spectrum can then be converted to a transmittance spectrum which is used to derive the CIELAB coordinates for the new thickness. In this way the dependence of the hue, saturation and lightness on optical path length can be modeled to give an understanding of how the color of diamond material with given absorption properties per unit thickness will depend on the optical path length.

The C* (saturation) numbers can be divided into saturation ranges of 10 C* units and assigned descriptive terms as below.

| | |
|---|---|
| 0-10 | weak |
| 10-20 | weak-moderate |
| 20-30 | moderate |
| 30-40 | moderate-strong |
| 40-50 | strong |
| 50-60 | strong-very strong |
| 60-70 | very strong |
| 70-80+ | very very strong |

As mentioned above, we have observed that the color of some CVD synthetic diamond material may vary across a color range, the color being unstable across this color range, and the observed color at any particular time depending on the recent history of the diamond material.

We have surprisingly found that irradiation (performed in a controlled manner) can be used, not to introduce color as has been used in the aforementioned prior art, but to reduce the color range over which the diamond material can exist. This means that the controlled irradiation tends to stabilize the color of the diamond material regardless of its environmental conditions or its recent thermal/illumination history. In preferred embodiments we have also found that not only can the color be stabilized, but also the equilibrium color (as hereinbefore defined) can be improved, by which we mean that the equilibrium color of the diamond material that has been subjected to the controlled irradiation treatment is a higher color grade (nearer to D on the GIA scale and/or has a lower C* value), i.e. it has what is generally considered to be a more desirable color (or lack of color) than the equilibrium color of the same diamond material prior to the controlled irradiation.

Our observations have shown that, for a nitrogen containing CVD synthetic diamond material round brilliant with a color grade on the GIA scale, and in particular for a nitrogen containing CVD synthetic diamond round brilliant with a starting color grade in the range F to Z (corresponding to 1 to 11 on the C* scale especially for a nitrogen containing CVD synthetic diamond material with a starting color grade in the range I to K on the GIA scale (corresponding to 2.5 to 3.99 on the C* scale), exposure to radiation, and in particular to UV radiation results in a color change of the diamond material to lower color grades (i.e. away from D grade on the GIA color scale), while thermal treatment, for example at a temperature of 525° C. for one hour, causes the diamond material to change color in the opposite direction to the higher, generally more desirable, (i.e. towards D grade on the GIA color scale) color grades. For example for a CVD synthetic diamond round brilliant of starting color grade K (C* 3.5-3.99) it is observed that exposure to UV radiation for 20 minutes results in a color change to a lower color grade L (C* 4-4.49), while subsequent heating to 525° C. for 1 hour results in a color change to higher grade I (C* 2.5-2.99), i.e. a total color grade difference of L to I (i.e. 3 color grade difference on the GIA scale, corresponding to a C* change of 1.5). Overall we have observed that for any given CVD synthetic diamond sample the overall color grade change when exposed to radiation and then thermally treated may vary by up to 1, up to 2, up to 3, up to 4, up to 5, even up to 6 color grades as measured on the GIA scale (corresponding to a C* change of up to 0.5, 1, 1.5, 2, 2.5 or even up to 3).

Similarly for fancy diamond (C*>11), a change of at least 0.5, or for some embodiments a change of at least 1 or 1.5 or 2, up to 4, 5 or even 6 in the value of C* may result from exposure to radiation and then thermal treatment.

This variation in color, and the associated variation in the absorption characteristics of the electromagnetic spectrum of the synthetic diamond material, on exposure to radiation (e.g. light) and heating is undesirable for some applications. As will be elucidated further, while the observed color of the synthetic diamond material is associated with specific defects (with specific electronic configuration) within the diamond material which give rise to absorption, color instability can be associated with charge transfer between these same defects in the crystal lattice, these charge transfer effects modifying the absorption spectrum. In practice it has been found that exposure of the diamond material to any radiation with energy greater than 2.0 eV leads to an increase in the absorption in the visible part of the spectrum, causing the diamond material color to change to a lower (generally considered less desirable) color grade (nearer to Z on the GIA scale if applicable, and/or higher C* value). While this increase can be removed by a simple low temperature (e.g. ~500° C.) thermal treatment, for most usual applications the diamond material will ordinarily be exposed to radiation with energy greater than 2.0 eV (for example sun light, fluorescent room lights etc). This means that for these usual applications the diamond material is always pushed towards a state where it contains those specific defects and associated specific electronic configurations that increase the absorption of the diamond material in the visible part of the spectrum, leading to lower, generally considered less desirable color grades (nearer to Z if the GIA scale is applicable, and/or to higher C* values). As mentioned above we refer to this "usual" state of a diamond material, when the diamond material is, or has recently been exposed to radiation, particularly to radiation with energy greater than 2.0 eV, as the "equilibrium state" or "equilibrium condition" and the color of the diamond material in this state as the "equilibrium color".

When a diamond material exhibits color instability this may be undesirable for a number of applications. Similarly the fact that the "equilibrium condition" corresponds to the highest absorption across the color range over which the diamond material is unstable is also undesirable for a number of applications.

Also where a diamond material exhibits color instability, this, as explained previously, can also impact the materials carrier properties (for example carrier mobility) and thus the material can show variable carrier mobility depending on the history of the diamond material. For some applications carrier mobility instability and, for example, the related instability in other electronic properties of the diamond material may be undesirable As examples of applications where the color instability and/or the carrier property instability, and/or the tendency for the equilibrium condition of the diamond material to correspond to the highest absorption across the color range over which the diamond material is unstable is undesirable, there may be mentioned the following:

(i) For diamond material used in certain optical applications such as Raman lasers or as a passive optical element in a high power laser operating the range from 225 nm to 1600 nm it is desirable that the absorption is minimized and stable.

(ii) In electronic devices made of diamond material, a key performance indicator is related to the carrier mobility. The mobility is reduced in materials which contain a high concentration of ionized (charged) impurities through carrier scattering. Any process which can lead to the number and type of these ionized impurities changing is undesirable as it can lead to an unstable electronic device.

(iii) While there are some exceptions in the field of fancy natural diamonds, it is undesirable for a diamond used in ornamental purposes to show color instability, not least related to difficulties associated with grading such a diamond.

The color change observed in the CVD synthetic diamond material on exposure to radiation and/or thermal treatment is thought to be due to a change in the charge state of one or more of the defects in the diamond material. This change in charge state is thought to arise from an electron or other charge transfer effect taking place within the diamond lattice. Thus the color instability that we observe is thought to result from these electron or other charge transfers.

Without limiting the invention in any way, a possible explanation for the charge transfer effects which give the color changes on exposure to radiation and heating is as follows. Neutral single substitutional nitrogen atoms ($N_s^0$) act as electron donors. Thermal or optical excitation of an electron from $N_s^0$ sites occurs as a result of either heating or radiation exposure respectively, the excited electrons being captured in some other kind of defect in the diamond structure, which defect sites we shall call "X". This charge transfer effect can be written as follows:

$$N_s^0 + X \leftrightarrow N_s^+ + X^- \qquad \text{(Equation 1)}$$

We believe that exposure of the diamond material to radiation, particularly to radiation with energy greater than 2.0 eV, and more specifically UV radiation, causes the equation to move to the left, resulting in changes to the absorption spectrum of the diamond material that result in a lower color grade (for example nearer to Z on the GIA scale and corresponding to a higher C* value); while thermal treatment of the diamond material causes the equation to move to the right, resulting in changes to the absorption spectrum of the diamond material that result in a higher color grade (for example nearer to D on the GIA scale and corresponding to a lower C* value). It is thought that the color that is observed in diamond material is associated with the presence of defect X in the diamond lattice, the charged defect $X^-$ being associated with a colorless state, or at least more colorless state.

Specifically we use X here to cover the unknown defect(s) in nitrogen doped CVD synthetic diamond material which take place in the charge transfer process. These defect(s) are thought to be responsible for the visible absorption features characterized by one or some combination of the 350 nm, 510 nm and the Ramp components.

An embodiment of the present invention provides a method comprising:

a) providing a nitrogen-containing diamond material which shows a measurable difference in at least one of its absorption characteristics in first and second states, the first state being after exposure to radiation having an energy of at least 5.5 eV, and the second state being after thermal treatment at 798 K (525° C.), b) treating the said nitrogen containing diamond material by controlled irradiation of the said nitrogen-containing diamond material so as to introduce sufficient defects in the diamond material so as to produce one or both of:

(i) an absorption coefficient measured at 77 K of at least 0.01 cm$^{-1}$ and at most 1 cm$^{-1}$ at a wavelength of 741 nm; and (ii) an absorption coefficient measured at 77 K of at least 0.01 cm$^{-1}$ and at most 0.5 cm$^{-1}$ at a wavelength of 394 nm;

whereby the measurable difference in the said absorption characteristics of the irradiation treated diamond material in the said first and second states, having been exposed to the same radiation and thermal treatment as the provided diamond, is reduced relative to the measurable difference in the said absorption characteristics of the provided diamond material in the said first and second states.

When we say the diamond material shows a measurable difference in its absorption characteristics we include any differences that can be recorded. This includes for example numerical absorption coefficients of the diamond material at various wavelengths, and visible changes, e.g. color changes that may be observed by the naked eye, or with the aid of magnification equipment.

The step of actually growing the CVD diamond material may or may not form part of the method of embodiments of the invention. Providing a CVD diamond material may mean growing the CVD diamond material, or may simply mean, for example, selecting a pre-grown CVD diamond material By "controlled irradiation" we mean applying an amount of irradiation so as to introduce the said sufficient defects in the diamond material so as to produce one or both of:

(i) an absorption coefficient measured at 77 K of at least 0.01 cm$^{-1}$ and at most 1 cm$^{-1}$ at a wavelength of 741 nm; and (ii) an absorption coefficient measured at 77 K of at least 0.01 cm$^{-1}$ and at most 0.5 cm$^{-1}$ at a wavelength of 394 nm.

We have observed that for the diamond materials of interest to the present specification exposure to radiation changes at least one of the absorption characteristics of the diamond material, the change increasing as the period of exposure is increased, and then leveling off after a certain period of exposure. The time at which this "leveling off" occurs depends on the intensity of the radiation and its energy. Preferably, in order to make worthwhile comparisons of diamond materials treated by methods according to the invention, the period of exposure to the said radiation is until substantially no further measurable change in the said absorption characteristics are found to occur. For example, for a diamond material whose color is one on the GIA scale, the period of exposure is preferably until the diamond material shows no further change in color grade on the GIA scale, for example such that sequential measurements show no further change in color on the GIA scale. As another measure, the period of exposure is preferably until the diamond material shows substantially no further change in its C* value, e.g. such that sequential measurements on the diamond material show a C* change of less than 0.5, preferably less than 0.4, more preferably less than 0.3, and even less than 0.2 or 0.1. Sequential measurements may be taken, for example, every hour, or every 20 minutes, or every two minutes, or every minute or every 30 seconds.

In use, the diamond material may be exposed to radiation with an energy less than 5.5 eV, e.g. less than 4.5 eV or less than 3.5 eV or even less than 2.5 eV, and for some diamond materials this lower wavelength exposure will also cause changes to its absorption characteristics, which it is desirable to stabilize. Such diamond material would also show changes to its absorption characteristics when exposed to radiation having an energy greater than 5.5 eV. The value of 5.5 eV is defined in this specification to encompass the broadest scope of diamond material that show changes to its absorption characteristics when exposed to radiation.

Those skilled in the art will realize that charged particles other than photons of electromagnetic radiation can also introduce electron hole pairs with energy >5.5 eV into the diamond lattice and hence affect the absorption characteristics. As examples there may be mentioned beta and alpha particles. The rest of this discussion focuses on the use of photons but this excitation source should not be seen to limit the invention, and reference in the invention to radiation of energy of at least 5.5 eV includes in its broadest scope charged particles of electromagnetic radiation other than photons with an energy greater than 5.5 eV.

Similarly we have observed that for the diamond material of interest to the present specification thermal treatment changes at least some of the absorption characteristics, the change increasing as the period of thermal treatment is increased, and then leveling off after a certain period of thermal treatment. The time at which this "leveling off" occurs depends inter alia on the temperature of the thermal treatment, and the nature of the diamond material. Preferably the period of thermal treatment is until substantially no further measurable changes to the said absorption characteristics are found to occur. For example, for a synthetic diamond 0.5 ct round brilliant with measured $C^*=3$, the period of thermal treatment is preferably until the diamond shows no further change in color grade on the GIA scale, for example such that sequential measurements show no further change in color on the GIA scale. As another measure, the period of thermal treatment is preferably until the diamond material shows substantially no further change in its $C^*$ value, e.g. such that sequential measurements on the diamond material show a $C^*$ change of less than 0.5, preferably less than 0.4, more preferably less than 0.3, and even less than 0.2 or 0.1. As before, sequential measurements may be taken, for example, every hour, or every 30 minutes, or every 10 minutes, or every two minutes, or every minute or every 30 seconds.

In use, the diamond material may be exposed to elevated temperatures for various lengths of time, and these elevated temperatures may be less than 525° C., but nonetheless result in absorption characteristic changes to the diamond material. For example exposure to elevated temperatures of at least 150° C., at least 200° C., at least 250° C., at least 400° C., or at least 450° C. for periods of 30 minutes, 1 hour, 5 hours, 10 hours or 24 hours, or even a week may result, for some diamond material in changes to its absorption characteristics, which it is desirable to stabilize. Such diamond material would also show changes to its absorption characteristics when thermally treated at 525° C. The recitation of thermal treatment at 525° C. is defined in this specification to encompass the broadest scope of synthetic diamond material that show changes to its absorption characteristics when exposed to elevated temperatures.

Thus if diamond material is shown to exhibit a change in at least one absorption characteristic when exposed to radiation of energy of at least 5.5 eV and a thermal treatment at 525° C., then it is diamond material which would benefit from controlled irradiation according to the method of the invention, even if in use it would never be exposed to such high temperatures or to light or other electromagnetic radiation of such high energy.

It is not fully understood why the irradiation step reduces the differences in the absorption characteristic of the diamond material in its first and second states (e.g. stabilizes the color), but it is thought that it may be because the controlled irradiation introduces specific defects into the diamond's crystal lattice which act as alternative donors/acceptors for electrons/holes (alternative to the X defects) subsequently excited by UV radiation or thermally treated, thereby substantially preventing, or at least reducing or minimizing charge transfer to the optical sites that were active in the diamond material prior to its treatment by controlled irradiation.

According to the invention the provided nitrogen-containing diamond material shows a measurable difference in at least one of its absorption characteristics in first and second states. Preferably it is the majority volume of the diamond material which shows this measurable difference, by which we means at least 55% and preferably at least 80% and most preferably at least 95% of the whole volume of the diamond material.

Defects can be introduced by any means that lead to the production of interstitials and vacancies within the diamond lattice. Those skilled in the art will be aware of a number of different routes to achieve this. The most common route is to use one or some combination of electrons, neutrons or gamma photons. Therefore in a preferred method according to the invention the controlled irradiation is provided by one or more of electrons, neutrons and gamma photons.

When energy is imparted to the diamond lattice there are four possible outcomes. Firstly the lattice may be undamaged and the energy transferred dissipated in the form of a phonon. Secondly, a carbon atom may be temporarily displaced from its lattice position but without sufficient energy to remain free from its original position, recombination occurring. Thirdly, the carbon atom may be displaced to a new interstitial site thus creating a vacancy. This vacancy-interstitial pair is known as a Frenkel defect. Fourthly, a carbon atom may receive enough energy to be moved out of its lattice position and knock other carbon atoms out of their lattice positions, producing a cascade of damage resulting in numerous interstitials and vacancies. Neutral vacancies are referred to in the field as $V^0$ and negatively charged vacancies as $V^-$.

Factors which affect the type, concentration and depth of damage include (a) the irradiation/implantation dose which has a primary impact on the density of defects produced, (b) the damaging particle's energy which affects the depth of damage and whether there is point damage or extended cascade damage, (c) the type of sample, for example the damage production rate in type Ib diamond material is ~7× times higher than for type IIa diamond material, (d) the temperature at which irradiation is carried out, this impacting both the type of defects formed (e.g. if the sample temperature exceeds 500 K) and the concentration of defects. The irradiation process itself can lead to in-situ annealing processes if the sample temperature is not carefully controlled. This is particularly an issue when using large beam currents/fluxes.

During the irradiation the sample temperature is preferably maintained at temperature below 400° C. For some preferred embodiments it is preferably maintained at a temperature less than 300° C., or less than 250° C., less than 200° C., less than 150° C., less than 100° C., less than 80° C., less than 50° C., less than 30° C. For some preferred embodiments it is preferably maintained at a temperature no lower than −200° C. (i.e. minus 200° C., preferably no lower than −150° C. (i.e. minus 150° C.).

For diamond material, the absorption characteristic at 741 nm and/or at 394 nm are characteristic of defects introduced by irradiation, and are discussed in more detail later in the specification. In general, when a diamond material is irradiated the higher the irradiation dose the higher the absorption coefficients at 741 nm and/or 394 nm.

We have found that the required controlled amount of irradiation is one that introduces sufficient interstitial defects in the diamond material as to produce an absorption coefficient measured at 77 K of at least 0.01 cm$^{-1}$ and at the most 1 cm$^{-1}$ at the wavelength of 741 nm (this is known in the field as the GR1 characteristic wavelength), and/or an absorption of at least 0.01 cm$^{-1}$ and at the most 0.5 cm$^{-1}$ at a wavelength of 394 nm (this is known in the field as the ND1 characteristic wavelength).

The maximum values of these coefficients recited in this specification, define the point when in themselves they add measurable absorption to distort the color of the diamond object, and the minimum value is that when enough additional defects have been created on irradiation to compete with the charge transfer process in Equation 1 and yield diamond material whose measurable difference in its absorption characteristics in its first and second states is reduced.

An absorption coefficient of at least 0.01 cm$^{-1}$ and at the most 1 cm$^{-1}$ at the wavelength of 741 nm (the so-called GR1 characteristic wavelength), corresponds to a concentrations of $V^0$ of at least 4 parts per billion (ppb) and at the most 0.15 parts per million (ppm). An absorption of at least 0.01 cm$^{-1}$ and at the most 0.5 cm$^{-1}$ at a wavelength of 394 nm (the so-called ND1 characteristic wavelength), corresponds to a concentration $V^-$ of at least 1 ppb and not more than 0.2 ppm. Concentrations of vacancies in ppm are calculated in a known standard manner by integrating the area of peaks from the absorption spectrum of the diamond material, and using published coefficients for comparison to calculate concentration. The coefficients that are used for the calculations of concentrations of vacancies in the present specification are those set out by G. Davies in Physica B, 273-274 (1999), 15-23, as detailed in Table A below.

TABLE A

| Defect | Calibration |
|---|---|
| $V^-$ | $A_{ND1} = (4.8 \pm 0.2) \times 10^{-16}[V^-]$ |
| $V^0$ | $A_{GR1} = (1.2 \pm 0.3) \times 10^{-16}[V^0]$ |
| NV | $A_{NV} = (1.4 \pm 0.35) \times 10^{-16}[N-V]$ |

In Table A, "A" is the integrated absorption (meV cm$^{-1}$) in the zero phonon line of the transition, measured at 77 K, with the absorption coefficient in cm$^{-1}$ and the photon energy in meV. The concentration of the defect is in cm$^{-3}$.

A preferred irradiation dose of electrons corresponds to an electron fluence of at least $1 \times 10^{15}$ electrons/cm$^2$, and/or preferably of at most $2 \times 10^{17}$ electrons/cm$^2$, more preferably to an electron fluence of at least $5 \times 10^{15}$ and/or preferably of at most $4 \times 10^{16}$ electrons/cm$^2$ (where "electrons/cm$^2$" is sometimes abbreviated to "e$^-$/cm$^2$"). One skilled in the art will realize that the required minimum and maximum dose will depend on the starting characteristics of the diamond material. By simple way of illustration a diamond sample containing a higher concentration of N and X may need a greater dose than a sample containing a lower concentration. Typically a 4.5 MeV electron beam can be used to provide the irradiation. It may provide a current in the range 0.5 mA to 400 mA e.g. 20 mA. It may be applied for a period of 10 seconds to 100 hours, e.g. about 2 minutes. As an example a 4.5 MeV electron beam with a current of 20 mA applied for 2 minutes provides a dose of $3.2 \times 10^{16}$ electrons/cm$^2$. It is preferred that the electrons are sufficiently energetic to impart a substantially uniform distribution of damage through the thickness of the diamond material. All doses/energies quoted in this specification are based on this presumption, but in principal the invention can be enacted using lesser energies, particularly a distribution of lesser energies.

We have found that the time for irradiation to achieve the desire electron fluence is preferably in the range 10 seconds to 10 hours, more generally in the range 10 seconds to 2 or 3 hours.

The irradiation treatment may be carried out at any suitable pressure, and is conveniently carried out at or near atmospheric pressure.

As mentioned above the measurable difference in at least some of the absorption characteristics of the treated (irradiated) diamond material in the said first and second states is reduced relative to that of the provided diamond material in the said first and second states by the method of the invention. What is typically desired is that the variation in the absorption characteristics leading to variation in color in the first and second states is reduced by the controlled irradiation treatment. Other features of the absorption spectrum, e.g. the absorption coefficient at 741 nm or 394 nm would be expected to rise due to the irradiation.

In preferred embodiments according to the invention (i) the absorption spectrum of the provided diamond material in one or both of its first and second states has (a) an absorption coefficient of at least 0.1 cm$^{-1}$ at 270 nm, and one or both of (b) an absorption coefficient of at least 0.05 cm$^{-1}$ at 350 nm and (c) an absorption coefficient of at least 0.02 cm$^{-1}$ at 510 nm; (ii) the measurable difference in the absorption characteristics of the provided diamond material in its first and second states is a difference in the absorption coefficient at one or both of 350 nm and 510 nm is at least 0.15 cm$^{-1}$; and (iii) the controlled irradiation treatment step reduces the said difference between the absorption coefficients in the first and second states at one or both of 350 nm and 510 nm by at least 0.05 cm$^{-1}$, preferably by at least 0.1 cm$^{-1}$, preferably at least 0.15 cm$^{-1}$. Thus in these embodiments precise measurement of the absorption coefficients can be used as the measure to determine the color stabilization achieved by the controlled irradiation.

In other embodiments according to the invention, the measurable difference in the absorption characteristics of the provided diamond material in its first and second states is a difference in the color grade saturation value C* of the provided diamond material in its first and second states of at least 0.5, and in some cases may be up to 1, 1.5, 2, 2.5, 3, 3.5, 4, 5, 6, 7 or 8.

C* is dependent on the size and geometry of the diamond material since it depends on the path length through the diamond material. Where C* values are given in the present specification they are based on a size and geometry for a diamond material that is a 0.5 carat (ct) round brilliant cut (RBC) stone. Where the diamond material used is actually a different size and geometry from a 0.5 ct RBC stone, then the measured C* value is adjusted. Therefore throughout this specification quoted C* value are those for an equivalent 0.5 ct RBC stone.

The difference in color saturation value C* is preferably reduced by 0.25, more preferably by 0.5, even by 1, 1.5, 2, 2.5, 3, 3.5, 4, 5, 6, 7, or even 8 by the controlled irradiation step. Preferably the treated diamond material has an absolute C* range between its first and second states of at most 0.5, or at most 1, 1.5, 2, or 3.

Thus in these embodiments measurement of C* is used as the measure to determine the absorption characteristic stabilization, e.g. the color stabilization achieved by the controlled irradiation.

In other embodiments according to the invention, the measurable difference in the absorption characteristics of the provided diamond material in its first and second states is a difference of at least two color grades or even 3, 4, 5, 6, 7, or 8 color grades, as measured on the GIA scale for diamond material.

As with C*, GIA scale measurements depend on path length, and as used in this specification all quoted GIA grades are for diamond material made into an equivalent 0.5 ct round brilliant cut stone.

The stated difference in GIA color grade is preferably reduced by the controlled irradiation step by at least one grade, and in some cases by preferably at least two grades, three grades, four grades five grades, six grades, seven grades, or even eight grades, as measured on the GIA scale. Preferably the difference is color grades between the diamond material in the first and second states is reduced so that the diamond material has the same color grade in its first and second states, or has a color grade difference in its first and second states that differs by no more than one grade, two grades, or three grades.

Thus in these embodiments optical analysis of the color and grading on the GIA scale is used as the measure to determine the color stabilization achieved by the controlled irradiation.

Preferably the color grade on the GIA scale of the irradiated diamond material in its equilibrium condition (as hereinbefore defined) is the same color grade or higher (i.e. nearer to D) than the color grade of the provided diamond material in its equilibrium condition, higher grades generally being considered preferable for most applications. Thus, in these cases the controlled irradiation can be seen not only to stabilize the color against changes due to exposure to radiation and temperature, but also to improve the absolute color of the diamond material. This is a significant difference to the prior art, with irradiation resulting in a higher color grade (lower C*) in the equilibrium condition, in addition to the color stabilization effect. In contrast in the prior art irradiation (which is not in the limited controlled manner of the present invention) results in more color (higher C*). More preferably the color grade of the irradiated diamond material in its equilibrium condition is at least one, preferably at least two, or even at least 3 or 4 grades higher than that of the provided diamond material in its equilibrium condition.

This preferred color improvement achieved by irradiation may also be defined in terms of the change in C* value of the diamond material. The preferred color improvement achieved by irradiation in terms of the C* value of the irradiated diamond material in its equilibrium condition (adjusted to be that of an equivalent 0.5 ct RBC stone) is the same as, or preferably at least 0.5, 1, 1.5 or even 2 lower than the C* value of the provided diamond material in its equilibrium condition.

In preferred methods according to our invention the irradiated diamond material has an absorption coefficient at 570 nm that is less than 0.04 cm$^{-1}$. Preferably the irradiated diamond material has an absorption coefficient at 570 nm that is less than 0.02 cm$^{-1}$, more preferably less than 0.01 cm$^{-1}$, especially preferably less than 0.05 cm$^{-1}$. In general measurable levels of noise in spectra are of the order of 0.05 cm$^{-1}$, so it is difficult to measure peak absorption coefficients that are less than 0.05 cm$^{-1}$. The low absorption coefficient at 570 nm is evidence that the irradiated diamond material has no, or limited numbers of NV defects, as distinguished from the prior art referred to hereinbefore which irradiates and anneals diamond material to introduce color and which has significant numbers of NV defects.

Methods according to the invention find particular application where the nitrogen concentration in the diamond material is such that there is a measurable difference in the absorption spectra of the provided diamond material after UV exposure and thermal treatment, that is in situations where there is typically a color change to stabilize. In practice this is found for diamond samples which contain SSN concentrations >0.01 ppm, preferably >0.03 ppm, preferably >0.05 ppm, preferably >0.08 ppm, preferably >0.10 ppm preferably >0.15 ppm preferably >0.20 ppm, preferably >0.30 ppm preferably >0.40 ppm preferably >0.50 ppm preferably >0.8 ppm, preferably >1 ppm, preferably >1.5 ppm, preferably >2.0 ppm, preferably >3.0 ppm, preferably >4.0 ppm, preferably >5.0 ppm, preferably >8.0 ppm, preferably >10 ppm, or preferably >20 ppm. Methods according to the invention are preferably applied to diamond material not dominated by high SSN. The methods are preferably applied to diamonds with SSN concentrations <150 ppm, preferably <100 ppm, preferably <75 ppm, preferably <50 ppm.

A second aspect of the present invention provides diamond material which has an absorption spectrum with one or both of the following characteristics:

| Designation | Peak | Absorption coefficient (at peak) |
|---|---|---|
| V$^0$ | 741 nm | 0.01 cm$^{-1}$-1 cm$^{-1}$ (at 77 K) |
| V$^-$ | 394 nm | 0.01 cm$^{-1}$-0.5 cm$^{-1}$ (at 77 K) |

These characteristics are an indication that controlled irradiation of the diamond material, as hereinbefore described with reference to the method according to the first aspect of the invention, has taken place.

The diamond material preferably has both of the characteristics designated V$^0$ and V$^-$ set out above.

Preferably the diamond material is a synthetic diamond material.

Preferably the synthetic diamond material is CVD diamond material and has an absorption spectrum with the following additional characteristics (i)

| Designation | Starts | Ends | Peak | Absorption coefficient (at peak) |
|---|---|---|---|---|
| 270 nm | 220 nm | 325 nm | 270 nm | 0.05 cm$^{-1}$-20 cm$^{-1}$ | and
(ii) one or more of

| Designation | Starts | Ends | Peak | Absorption coefficient (at peak) |
|---|---|---|---|---|
| 350 nm band | 270 nm | 450 nm | 350 nm ± 10 nm | 0.05 cm$^{-1}$-10 cm$^{-1}$ |
| 510 nm band | 420 nm | 640 nm | 510 nm ± 50 nm | 0.02 cm$^{-1}$-10 cm$^{-1}$ |

| Designation | Form of Curve | Absorption Coefficient |
|---|---|---|
| Ramp | Rising background of form Absorption coefficient (cm$^{-1}$) = C × λ$^{-3}$ (C = constant, λ in μm) | Contribution at 510 nm is: <1.5 cm$^{-1}$ |

Preferably the CVD synthetic diamond material has any two, or more preferably all three, of the characteristics set out in (ii) above.

Preferred values of the absorption characteristics are shown in the table below.

| Designation | Starts | Ends | Peak | Absorption coefficient (at peak) | |
|---|---|---|---|---|---|
| 270 nm | 220 nm | 325 nm | 270 nm | | $0.05\ cm^{-1}$-$20\ cm^{-1}$, |
| | | | | preferably | $0.1\ cm^{-1}$-$8\ cm^{-1}$, |
| | | | | more preferably | $0.2\ cm^{-1}$-$5\ cm^{-1}$ |
| 350 nm band | 270 nm | 450 nm | 350 nm ± 10 nm | | $0.05\ cm^{-1}$-$10\ cm^{-1}$, |
| | | | | preferably | $0.10\ cm^{-1}$-$5\ cm^{-1}$, |
| | | | | more preferably | $0.20\ cm^{-1}$-$3\ cm^{-1}$ |
| 510 nm band | 420 nm | 640 nm | 510 nm ± 50 nm | | $0.02\ cm^{-1}$-$10\ cm^{-1}$, |
| | | | | preferably | $0.03\ cm^{-1}$-$4\ cm^{-1}$, |
| | | | | more preferably | $0.1\ cm^{-1}$-$2\ cm^{-1}$ |
| $V^0$ | | | 741 nm | | $0.01\ cm^{-1}$-$1\ cm^{-1}$ |
| | | | | preferably | $0.05\ cm^{-1}$-$0.5\ cm^{-1}$ |
| | | | | more preferably (all at 77 K) | $0.1\ cm^{-1}$-$0.3\ cm^{-1}$ |
| $V^-$ | | | 394 nm | | $0.01\ cm^{-1}$-$0.5\ cm^{-1}$ |
| | | | | preferably | $0.015\ cm^{-1}$-$0.4\ cm^{-1}$ |
| | | | | more preferably (all at 77 K) | $0.02\ cm^{-1}$-$0.2\ cm^{-1}$ |

| Designation | Form of Curve | Absorption Coefficient | |
|---|---|---|---|
| Ramp | Rising background of form Absorption coefficient $(cm^{-1}) = C \times \lambda^{-3}$ (C = constant, $\lambda$ in μm) | Contribution at 510 nm is: preferably more preferably | $<1.5\ cm^{-1}$, $<1.0\ cm^{-1}$, $<0.5\ cm^{-1}$ |

Preferred diamond materials according to the invention may have one or more of the preferred absorption coefficient characteristics, in any combination.

Where a range of preferred absorption coefficients are given, these are to be interpreted to represent separate preferred upper and lower limits. For example for the 270 nm designation band, the preferred absorption coefficient range from $0.15\ cm^{-1}$ to $8\ cm^{-1}$ represents a preferred minimum coefficient of $0.15\ cm^{-1}$ and a preferred maximum coefficient of $8\ cm^{-1}$.

The provided diamond material in the method according to the first aspect of the invention, and the diamond material of the second aspect of the invention are preferably single crystals. In certain embodiments according to the first and second aspects of the invention, where the diamond material is a single crystal, the single crystal is in the form of a gemstone. As an alternative the diamond material may be polycrystalline. Polycrystalline diamond materials lead to light scatter in the visible part of the spectrum. The invention is therefore likely to find most application for polycrystalline diamond material when the stabilization that is required is related to properties other than optical absorption, for instance dielectric loss and carrier mobility.

Embodiments and examples of the invention will now be described, by way of example, with reference to the following figures, wherein:

FIG. 1, which has been referred to above, shows a spectral decomposition of the UV/visible absorption spectrum of an orangish brown CVD synthetic diamond layer;

Figure 6:
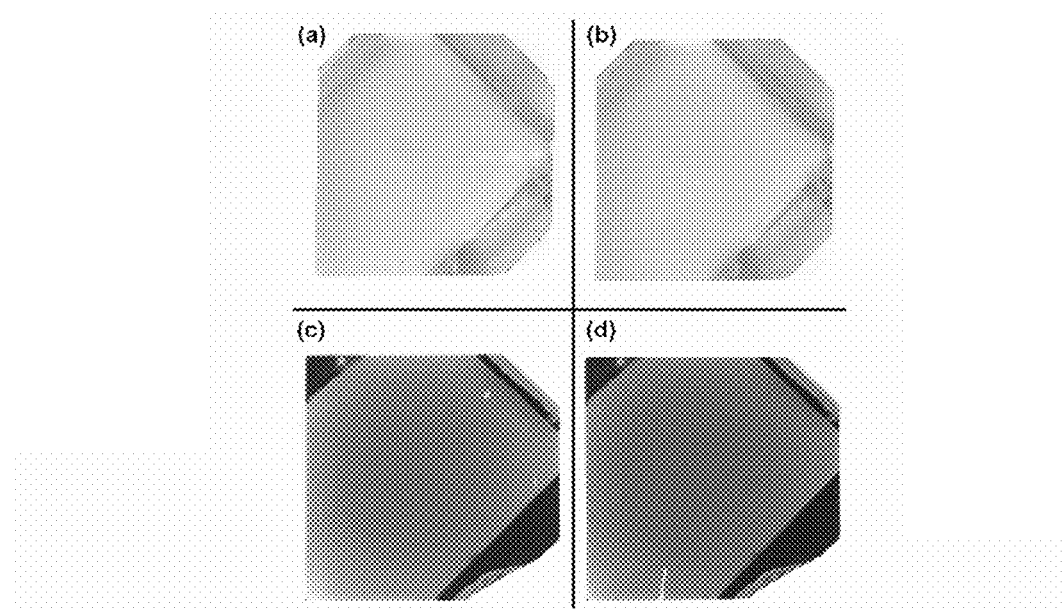
FIGS. 6a and 6b are optical micrographs showing example 2 after thermal treatment and UV radiation exposure respectively.
Figure 7:
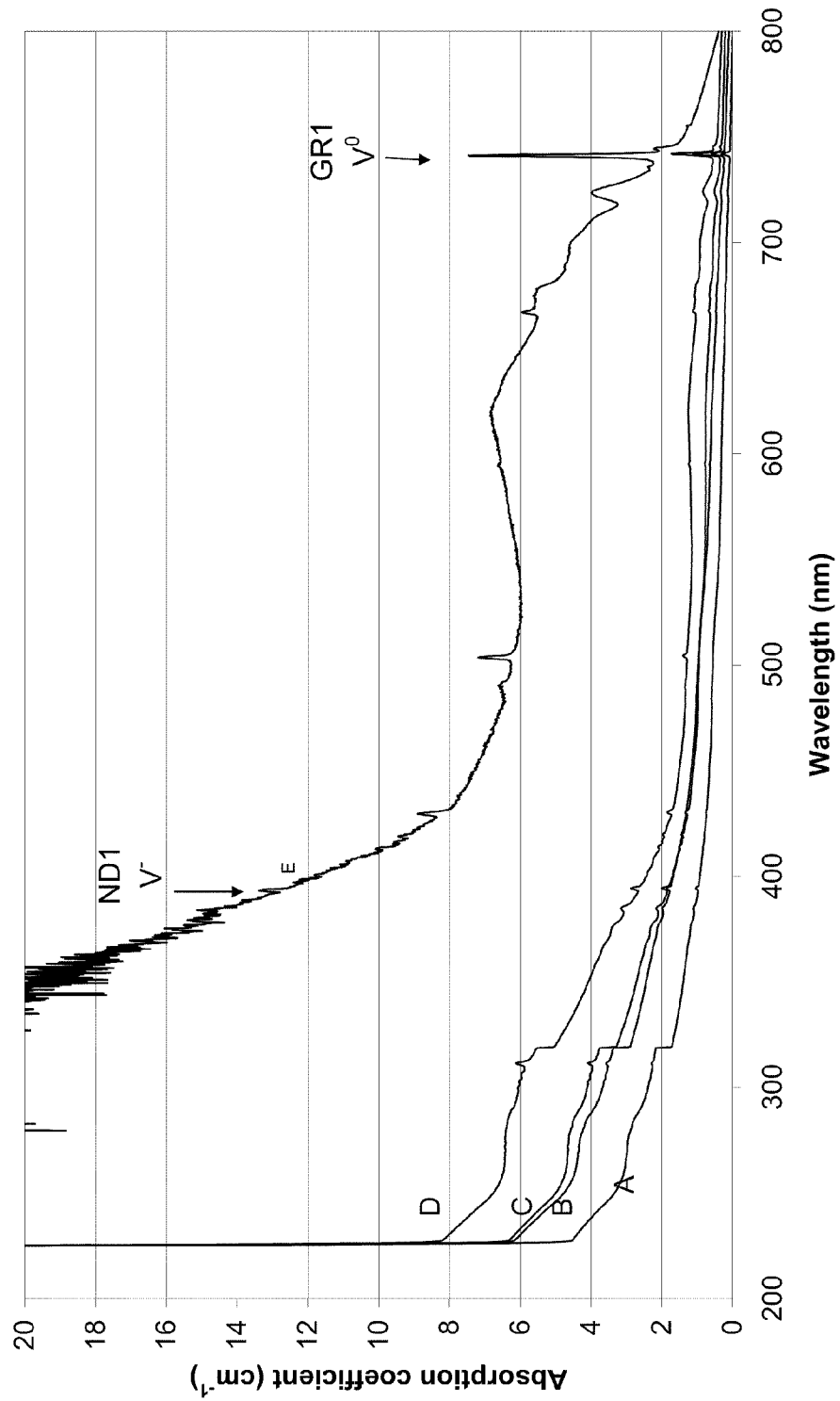

FIGS. 6c and 6d are optical micrographs showing example 3 after thermal treatment and UV exposure respectively; and FIG. 7 shows the absorption spectra measured at 77 K for examples 10-15 which have been irradiated with different doses.

EXAMPLE 1

A CVD diamond material sample was grown on an HPHT substrate in the manner described in WO2003/052177 as set out below.

HPHT diamond substrates suitable for synthesizing single crystal CVD synthetic diamond material of the invention were laser sawn, lapped into substrates, polished to minimize subsurface defects such that the density of defects is below $5 \times 10^3/mm^2$, and generally is below $10^2/mm^2$. Polished HPHT plates 3.6 mm×3.6 mm laterally by 500 μm thick, with all faces substantially {100} and having a surface roughness $R_Q$ (also known as the root mean square roughness) of less than 1 nm on the surfaces where homoepitaxial diamond growth will subsequently take place, were mounted on a molybdenum disk, and introduced into a CVD synthetic diamond growing reactor. By substantially {100} faces we means faces that are exactly {100} faces and also faces that deviate from this by up to 10°.

Growth Stages

1) The CVD synthetic diamond reactor was pre-fitted with point of use purifiers, reducing unintentional contaminant species in the incoming gas stream to below 80 ppb.
2) An in situ oxygen plasma etch was performed using 50/40/3000 sccm (standard cubic centimeter per second) of $O_2/Ar/H_2$ and a substrate temperature of 760° C.
3) This moved without interruption into a hydrogen etch with the removal of the $O_2$ from the gas flow.
4) This moved into the growth process, at a suitable pressure, by the addition of the carbon source (in this case $CH_4$) and dopant gases. In this instance was $CH_4$ flowing at 165 sccm and 0.7 ppm $N_2$ was present in the process gas mix. The temperature at this stage was 875° C.
5) On completion of the growth period, the substrate was removed from the reactor and the CVD synthetic diamond layer removed from the substrate by laser sawing and mechanical polishing techniques.

This grown CVD synthetic diamond material is the "provided diamond material" defined by the claims of the present specification.

The room temperature absorption spectrum of the grown sample was then measured using a Perkin Elmer Lambda 19 spectrophotometer. The recorded spectrum is shown as trace A on FIG. 2a. The sample was subsequently exposed to 20 minutes UV radiation from a deuterium lamp source set at 230 mA and 76 V and the room temperature absorption spectrum was then re-measured. The deuterium lamp source was an EEO plc lamp source, catalogue number 37-4702, serial number 246/031. The re-measured room temperature absorption spectrum is trace B on FIG. 2a. The sample was then removed from the spectrometer and heated in an Elite Thermal System tube furnace at 798 K for 1 hour in the dark under vacuum, and the room temperature optical absorption spectrum was retaken. This is shown as trace C on FIG. 2a.

Figure 1:
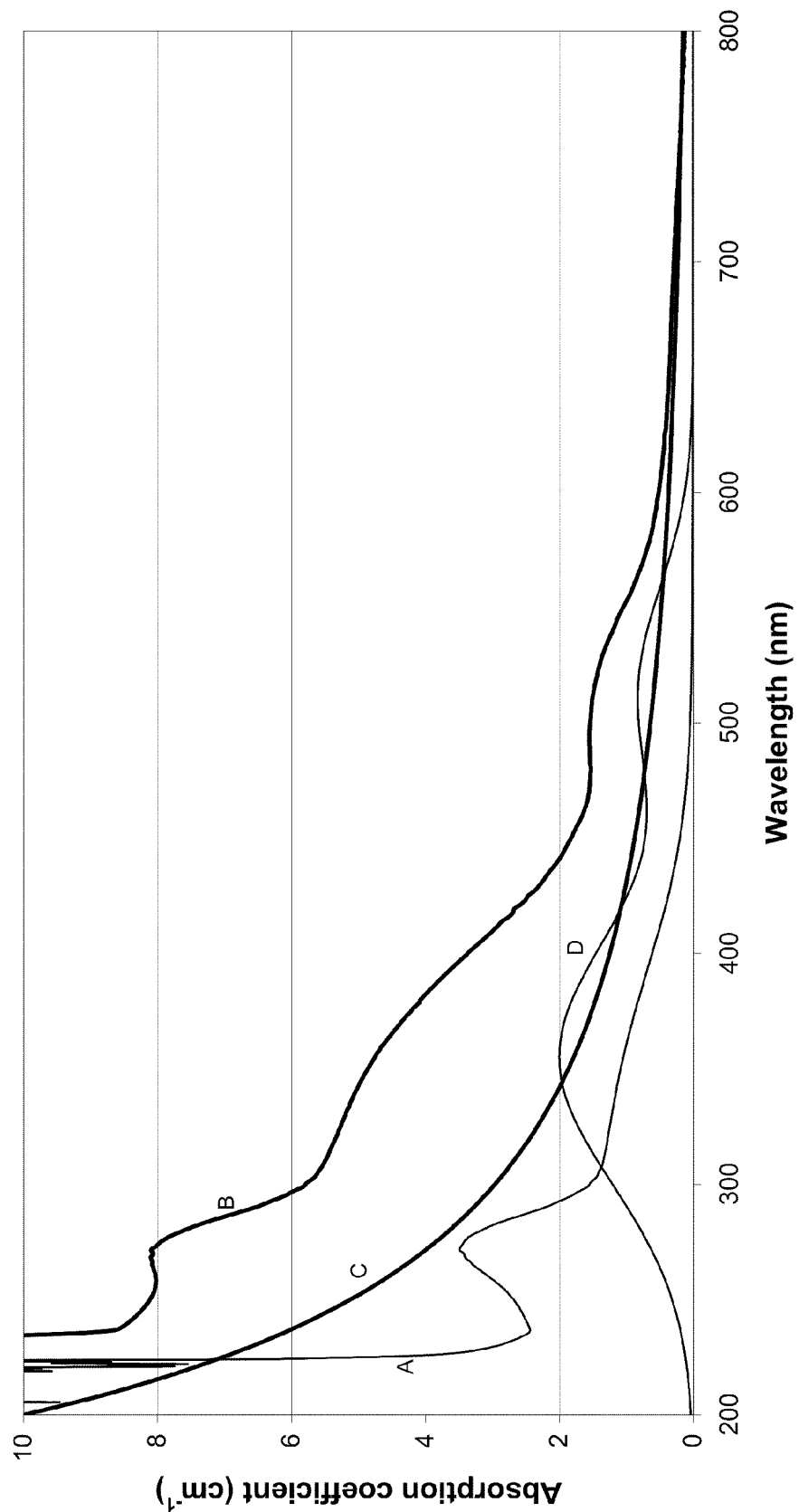
Figure 2A:
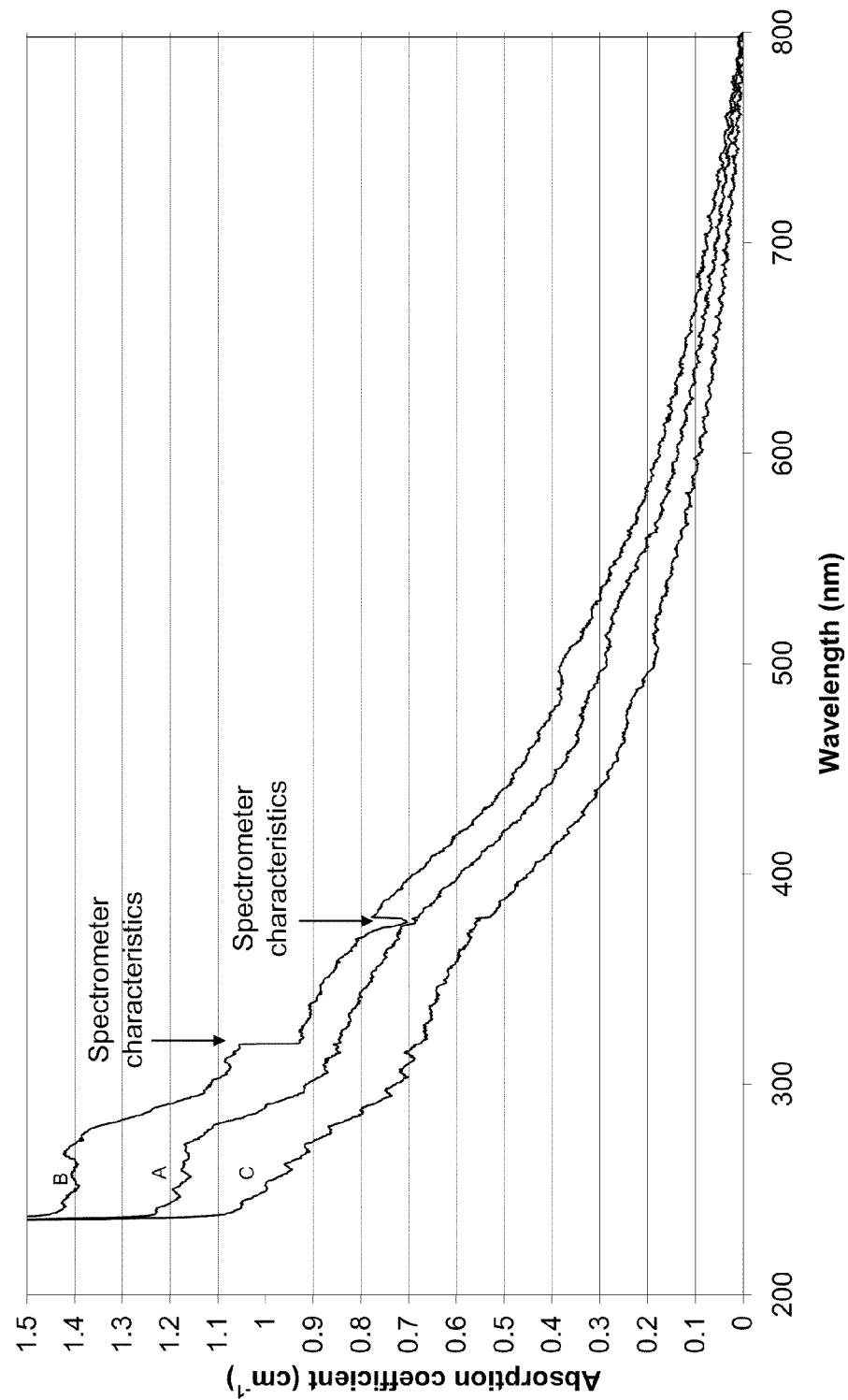
FIG. 2a shows a room temperature absorption spectrum for a CVD synthetic diamond material according to Example 1, as-grown (curve A), after UV exposure (curve B), and after thermal treatment at 525° C. (curve C), but prior to the controlled irradiation treatment of the method of the present invention.

It will be seen from FIG. 2a that the spectrum showed typical CVD characteristic features at 350 nm and 510 nm as well as a broad band at 270 nm, the latter being associated with single substitutional nitrogen. The absorption coefficients at each of these wavelengths, as measured from the spectra, are shown in Table 1 below:

TABLE 1

|  | 270 nm | 350 nm | 510 nm |
| --- | --- | --- | --- |
| As grown = "provided diamond material" | 1.16 cm$^{-1}$ | 0.78 cm$^{-1}$ | 0.30 cm$^{-1}$ |
| Post 20 minutes UV exposure | 1.46 cm$^{-1}$ | 0.87 cm$^{-1}$ | 0.34 cm$^{-1}$ |
| Post 1 hour thermal treatment | 0.92 cm$^{-1}$ | 0.62 cm$^{-1}$ | 0.18 cm$^{-1}$ |

From measurements taken from the 270 nm peak the sample was found to have nominally 0.1 ppm neutral single substitution nitrogen.

CIELAB C* values for the as grown (or "provided") CVD synthetic diamond material, the UV exposed diamond material, and the thermally treated diamond material were derived from traces A B and C respectively of the absorption spectra of FIG. 2. The method for obtaining these is well known, and is described for example in US patent application 2004/0194690. The derived C* values are shown in Table 2, alongside the equivalent GIA scale color grade letter.

TABLE 2

|  | As grown | Post UV exposure | Post thermal treatment | Change |
| --- | --- | --- | --- | --- |
| C* | 3.72 | 4.37 | 2.97 | 1.4 |
| GIA equivalent color grade (0.5 ct RBC stone) | K | L | I | 4 grade range |

From FIG. 2a and the data shown in Table 2, it can be seen that the grown CVD synthetic diamond material's absorption spectrum is not stable to exposure to these different conditions (UV exposure then thermally treated). The change in C* is 1.4, and in terms of the GIA color grading system this change in C* (Table 2) is equivalent to a range of 4 color grades. The GIA grading of the CVD synthetic diamond material is K post growth, L following the UV exposure and I following the thermal treatment (a color range of I, J, K, L i.e. 4 color grades).

In a known manner an absorption spectrum was then recorded at 77 K (not shown) to determine the upper limits of the concentration of vacancy ($V^0$ and $V^-$) and nitrogen vacancy defects ($[N-V]^0$ and $[N-V]^-$) in the diamond material. These concentrations were determined in a known manner by integrating the areas of the peaks from the absorption spectrum at the wavelengths known to be characteristic of these defects. The UV-Visible spectra were taken at a scan speed of 60 nm/min, at 0.2 nm data intervals and the baseline subtracted before the peaks areas were integrated. These upper limits are shown in Table 3. As is known, it is usual to carry out this analysis of defect concentrations associated with vacancy and nitrogen-vacancy defects at low temperatures, e.g. 77 K, since at higher temperatures the peak in the absorption spectrum that is associated with them defect is smoothed and therefore less visible.

TABLE 3

| Absorption Peak | Defect Model | Defect concentration cm$^{-3}$ [ppm] |
| --- | --- | --- |
| 741 nm | $V^0$ | <6 × 10$^{14}$ [<0.004] |
| 394 nm | $V^-$ | <2 × 10$^{14}$ [<0.001] |
| 637 nm | $[N-V]^-$ | <5 × 10$^{14}$ [<0.003] |
| 575 nm | $[N-V]^0$ | <5 × 10$^{14}$ [<0.003] |

The sample was then exposed to daylight for six hours. Daylight exposes the diamond material to radiation with an energy greater than 2.0 eV. The absorption spectrum was re-measured and was characterized by a C* value of 3.50 with an equivalent GIA color grade of K. Further exposure to daylight was shown not to significantly alter the properties of the diamond. After a second UV treatment similar to the first the absorption spectrum returned to that shown in FIG. 2a (curve B). The spectrum was re-measured after a period of 24 hours and did not change from that shown in FIG. 2a (curve B). Following a second thermal treatment at 798 K the spectrum was re-measured and found to be identical to that in FIG. 2a (curve C). This cycling between the extreme color grades following thermal treatment/UV radiation procedure was repeated three further times. Each time the absorption properties were characterized by the same characteristics as the first time. This indicates that even after repeated cycling of UV exposure and thermally treating the sample's absorption properties in each state are consistent but that they are not stable.

The sample, uncoated, un-mounted and clean, was then subjected to a controlled irradiation treatment according to the method of the invention. To do this the sample was treated using 4.5 MeV electrons at a beam current of 20 mA for 2 minutes, corresponding to an approximate dose of $3.2 \times 10^{16}$ electrons/cm$^2$.

Following this treatment the UV/Visible spectra of the sample in the irradiated form, after subsequent exposure to UV radiation and after subsequent heating were plotted (not shown) and CIELAB C* values were derived from the absorption spectra. The derived C* values are shown in Table 4.1:

TABLE 4.1

|  | Post electron irradiation | Post electron irradiation and UV exposure | Post electron irradiation and thermal treatment | Change |
|---|---|---|---|---|
| C* | 3.99 | 3.96 | 3.32 | 0.67 |
| GIA equivalent color grade (0.5 ct RBC stone) | K | K | J | 2 Grade range |

Comparing the data in Table 2 and Table 4, it is clear that the impact of the electron irradiation has led to a significant reduction in the variation in the sample's absorption properties compared with the pre-treated sample.

Table 4.2 below shows the reduction in change of absorption between the two states following the addition of a short irradiation. In some parts of the spectrum the absorption can increase, but the difference is reduced and the color in terms of C* and GIA is improved because of the flattening of the spectrum. In table 4.2 the measured absorption coefficients post the electron irradiation are shown. When these are compared with those in Table 1 it can be seen that the difference between absorption coefficients measured after UV exposure and heat treatment reduces after irradiation as follows: at 350 nm from 0.25 cm$^{-1}$ to 0.13 cm$^{-1}$, at 510 nm from 0.16 cm$^{-1}$ to 0.01 cm$^{-1}$.

TABLE 4.2

|  | 270 nm | 350 nm | 510 nm |
|---|---|---|---|
| Post 2 minutes electron irradiation | 1.74 | 1.19 | 0.39 |
| Post 20 minutes UV exposure | 1.70 | 1.13 | 0.36 |
| Post 1 hour thermal treatment | 0.95 | 1.26 | 0.37 |

Figure 2B:
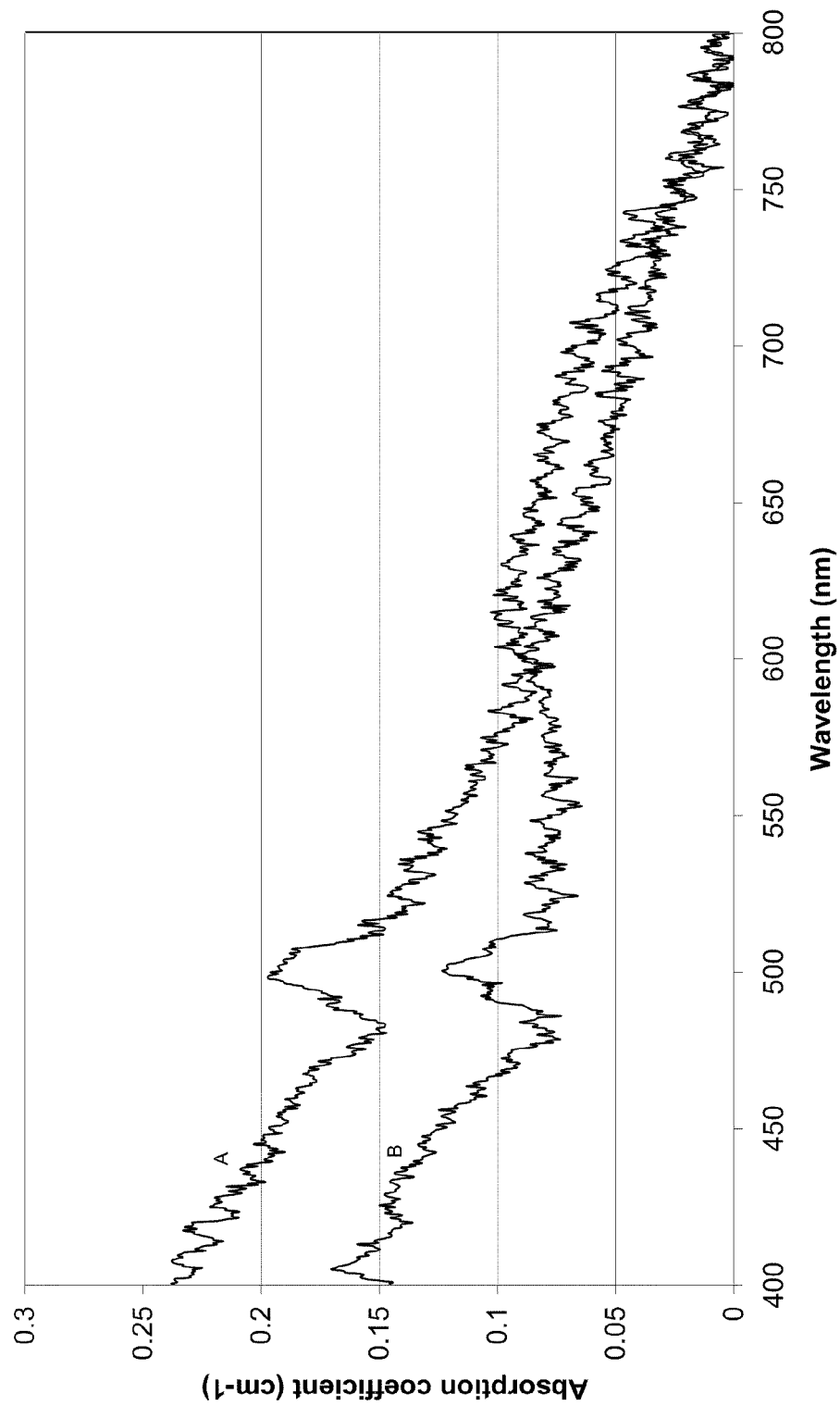
FIG. 2b shows a "difference" absorption spectrum for the CVD synthetic diamond material according to Example 1 after exposure to ultraviolet radiation and thermal treatment at 525° C. after an electron irradiation dose according to a method of the present invention (curve B) and in the as-grown provided state (curve A).

Thus it can be seen from the comparison of the results in Table 4.2 and Table 1 that the difference in absorption coefficient after exposure to ultraviolet radiation and then subject to thermal treatment is reduced by the step of applying a controlled irradiation to the diamond material. This reduction is similarly illustrated in FIG. 2b which is an absorption difference spectrum which plots the difference in the absorption coefficient at any given wavelength calculated by subtracting the absorption coefficient after thermal treatment from the absorption coefficient after exposure to UV radiation. In FIG. 2b curve B shows the absorption difference spectrum for the diamond material after the controlled irradiation treatment, and curve A shows the absorption difference spectrum of the as-grown provided diamond material.

Figure 3:
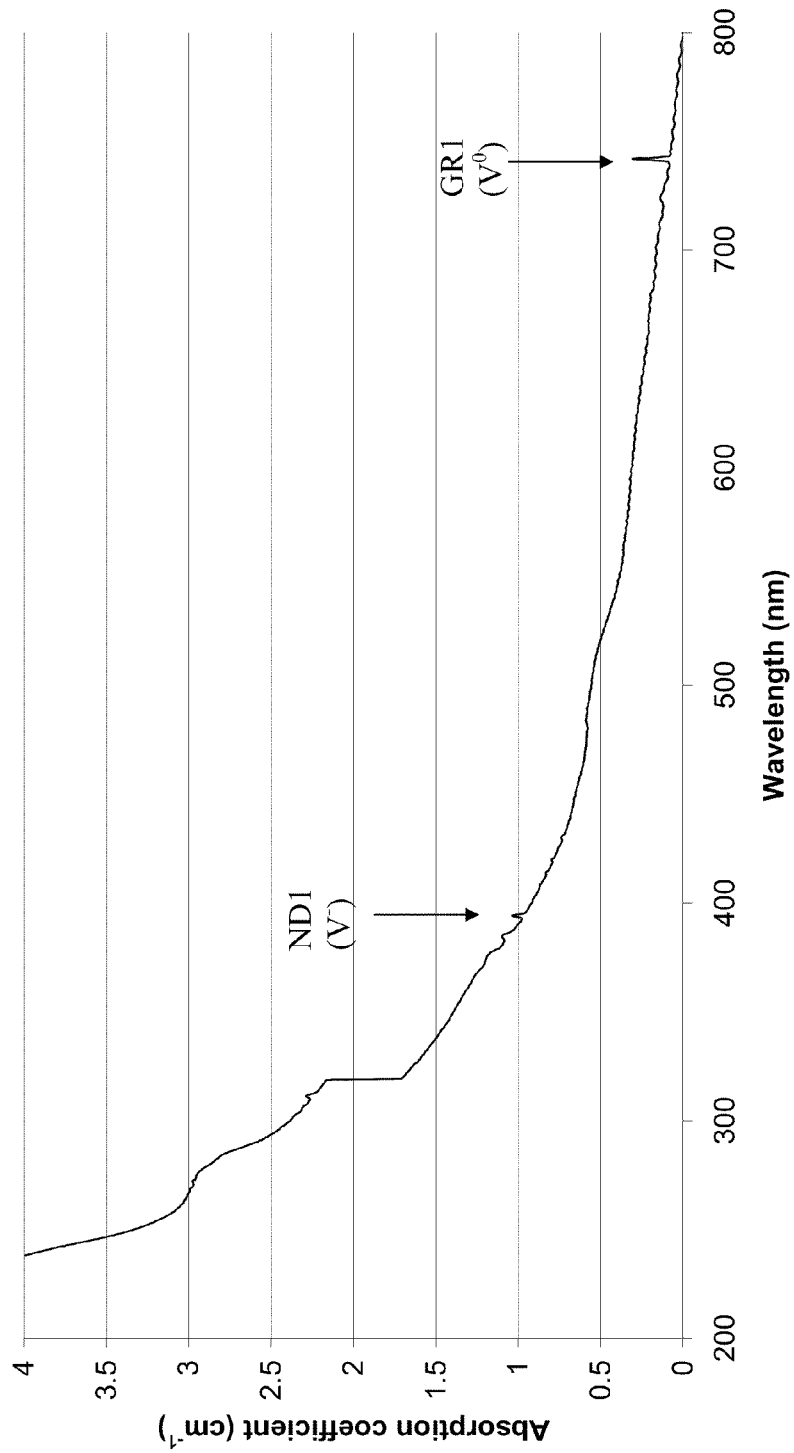
FIG. 3 shows an absorption spectrum, measured at 77 K, of the grown CVD synthetic diamond material of Example 1 after controlled irradiation treatment.

In a known manner, as described earlier, a UV/visible spectrum was then taken at 77 K of the irradiated sample to investigate defect concentrations within the sample. The spectrum is shown in FIG. 3 and shows that in addition to improving the sample's absorption stability, a number of features are present which are characteristic of the electron irradiation treatment. Specifically these include the vacancy related absorptions at 394 nm (ND1) and 741 nm (GR1) corresponding to the negative and neutral charge states respectively of the single vacancy in diamond material. From these absorptions the concentration of characteristic irradiation damage defects was derived and these are shown in Table 5. These derivation techniques are known in the art and described for example in G. Davies, Physica B, 273-274 (1999), 15-23.

TABLE 5

| Absorption Peak | Defect Model | Peak Height (cm$^{-1}$) | Defect concentration cm$^{-3}$ [ppm] |
|---|---|---|---|
| 741 nm | V$^0$ | 0.21 | $5.13 \times 10^{15}$ [0.029] |
| 394 nm | V$^-$ | 0.05 | $2.02 \times 10^{15}$ [0.012] |
| 637 nm | [N-V]$^-$ | 0 | $<5 \times 10^{14}$ [<0.003] |
| 575 nm | [N-V]$^0$ | 0 | $<5 \times 10^{14}$ [<0.003] |

Further photoluminescence recorded at 77 K using 458 nm excitation showed features at 533 and 467 nm which are thought to be unique and characteristic of CVD synthetic diamond material. In addition, to more usual irradiation damage features (for example TR12 at 471.2 nm) features at 512.6, 526.4 and 486.2 nm with Raman normalized intensities of 0.095, 0.001 and 0.01 respectively were also present post the electron irradiation but not prior.

EXAMPLES 2 AND 3

Example 2 and 3 were grown using the method of Example 1 with the exception the concentrations of nitrogen (measured as N$_2$ equivalent) in the gas phase were increased to 7 ppm and 11 ppm respectively. These samples were processed into polished single crystal CVD plates with dimensions 3.4 mm×3.5 mm×2.2 mm (Example 2) and 3.7 mm×3.6 mm×1.1 mm (Example 3).

Figure 4:
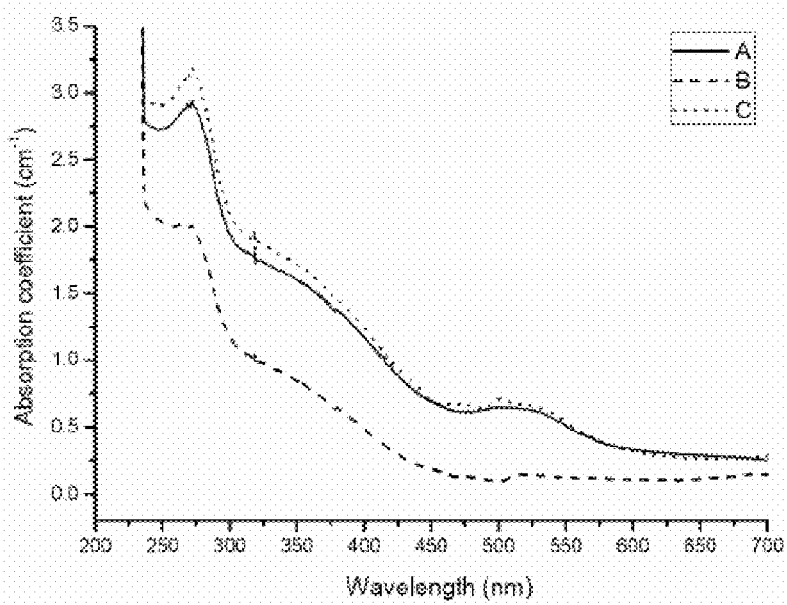
FIG. 4 shows a room temperature absorption spectrum for a CVD synthetic diamond sample according to Example 3, as grown (curve A), after UV exposure (curve B) and after thermal treatment (curve C), but prior to the controlled irradiation treatment of the method of the present invention.

Room-temperature UV/visible optical absorption data between 200 nm and 800 nm for Example 3 in its initial grown provided state (A, solid line), following heating up to 798 K (B, dashed line) and following exposure to ultraviolet radiation for a duration of 40 minutes (C, dotted line) is shown in FIG. 4.

Using the optical absorption spectra for the grown ("provided") diamond but un-irradiated sample of Example 3, following ultraviolet illumination and following heating, the concentration of N$_s^0$ centers were derived using the 270 nm absorption peak and the absorption coefficients of the 350 nm and 510 nm absorption bands were noted. These are shown in Table 6:

TABLE 6

|  | Before treatment | Following UV irradiation | Following heating |
|---|---|---|---|
| N$_s^0$ [270 nm band] (ppm) | 0.50 | 0.30 | 0.65 |
| 350 nm band (cm$^{-1}$) | 0.4 | 0.2 | 0.5 |
| 510 nm band (cm$^{-1}$) | 0.3 | 0.1 | 0.3 |

Figure 5:
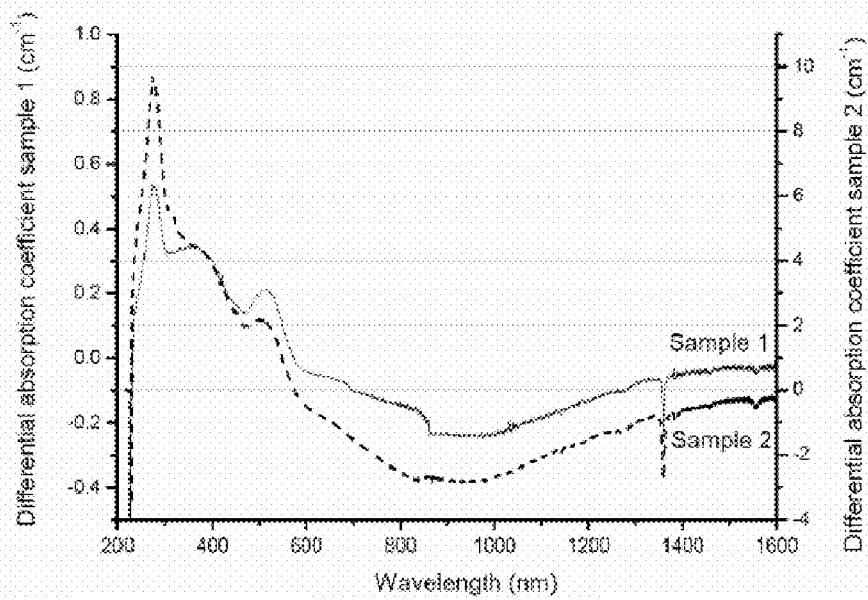
FIG. 5 shows the room temperature absorption difference spectra for CVD synthetic diamond material according to examples 2 and 3, deduced by subtracting the absorption coefficient values as a function of wavelength measure after thermal treatment from those measured after UV exposure.

UV/Visible/NIR (near-infrared) absorption difference spectra were then derived for Example 2 and Example 3. These are shown in FIG. 5, deduced by subtracting the absorption coefficient values as a function of wavelength measured after ultraviolet illumination (40 minutes duration) with those values measured after heating (to 798 K). More positive values indicate a feature has increased in strength after illumination, and more negative values indicate that it has increased after heating. From these the changes in absorption coefficient at 270 nm, 350 nm and 510 nm after the UV exposure/thermal treatment are evident. In FIG. 5, the "sample 1" curve corresponds to Example 2, and the "sample 2" curve corresponds to Example 3.

Optical micrographs were taken of Example 2 and are shown in FIGS. 6a and 6b. FIG. 6a shows the example after heating to 798 K, FIG. 6b shows the example following 40 minutes of ultraviolet irradiation, FIG. 6c shows Example 3 after heating to 823 K and FIG. 6d shows example 3 following 40 minutes of ultraviolet irradiation. All micrographs were taken at room temperature using a transmission microscope. From the micrographs it can be seen that UV exposure tends to intensify the color of the samples, whereas thermal treatment tends to de-intensify the color of the samples. In this specification the micrographs are shown in grayscale. In fact the true colors are clear (FIG. 6a), light pink (FIG. 6b), light brown (FIG. 6c) and dark brown (FIG. 6d).

C* (scaled to give values for thickness equal to the depth of a 0.5 ct round brilliant cut stone) values were calculated from the absorption spectrum shown in FIG. 5 for Example 3 and are shown in Table 7 below.

TABLE 7

|  | As grown | Post UV exposure | Post heating | Change |
| --- | --- | --- | --- | --- |
| C* | 4.85 | 5.43 | 1.64 | 3.79 |

As with Example 1, this example shows a clear change in C* when exposed to UV and then thermally treated. Similarly to Example 1, it was found that the absorption spectrum could be repeatedly driven between the two extremes on UV exposure/thermal treatment indefinitely clearly indicating color instability.

Extrapolating from our experimental testing on Example 1, it is believed that the diamond materials of Examples 2 and 3 when electron irradiated to a total dose of $4 \times 10^{16}$ cm$^{-2}$ using similar conditions to that for Example 1 would result in a reduction in the change in C* of the diamond materials when measured in their first and second states of at least 20%. That is we would predict that the C* value change in its first and second state would reduce by about 0.5 after the irradiation.

EXAMPLES 4-7

Four more CVD synthetic diamond samples with the same nitrogen content as Example 1, and grown and prepared into plates in identical fashion to Example 1 were subjected to UV radiation/thermal treatment in the same manner as for Example 1, in order to ascertain the repeatability of the method of the invention. In all four examples, the color grade was again shown to change by 3-4 color grades when measured after exposure to UV radiation and then after the thermal treatment. These CVD synthetic diamond samples were subsequently electron irradiated in the same manner as the sample of Example 1. The results after electron irradiation are summarized in Table 8. The C* values and color grades are derived from the measured absorption spectra according to the method described above.

TABLE 8

| Example | After 20 minutes UV exposure - C* (GIA color grade) | After 1 hour thermal treatment at 525° C. - C* (GIA color grade) | Color Grade range |
| --- | --- | --- | --- |
| Ex 4 | 3.83 (K) | 3.06 (J) | 2 grades |
| Ex 5 | 3.02 (J) | 3.00 (J) | 1 grade (i.e. no change) |
| Ex 6 | 2.92 (I) | 2.55 (I) | 1 grade (i.e. no change) |
| Ex 7 | 1.96 (G) | 1.96 (G) | 1 grade (i.e. no change) |

From table 8 it can be seen that irradiation causes the color variation between the two extremes (after UV exposure and thermal treatment) to reduce to less than a grade (on the GIA scale), corresponding to a change in C* of less than 0.8. The examples therefore show stabilization of color after irradiation similar to that illustrated for Example 1. C* values and color grades are derived from the absorption spectra using the methods described hereinbefore.

EXAMPLE 8 (COMPARATIVE)

A CVD sample prepared with low nitrogen concentration was prepared by a manner similar to that described for Example 1, but with nitrogen concentration in the gas phase that was nominally 92 ppb giving rise to a concentration of 0.01 ppm in the solid. The modeled C* and GIA grades for a 0.5 ct round brilliant produced from the sample after UV exposure and thermal treatment are shown in Table 9 below.

TABLE 9

| Example | Starting color C* (GIA grade) | Color after 20 minutes UV C* (GIA grade) | Color after 1 hour at 525° C. C*(GIA grade) | Color grade range |
| --- | --- | --- | --- | --- |
| 8 | 0.59 (E) | 0.57 (E) | 0.72 (E) | 1 grade (i.e. no change) |

The results for the comparative Example 8 show that when the $N_s^0$ and X concentrations are low enough the color change affect is not seen on exposure to UV irradiation/thermal treatment. This is a comparative example since there is not measurable difference in the absorption characteristics in the first and second states (after UV exposure and after thermal treatment). While there are slight differences in the C* values these are too small to be significant. There is no change in the GIA color grades in the first and second states.

This sample was not irradiated since it is a comparative example and there was no color change to stabilize.

EXAMPLES 9-15

CVD grown synthetic diamond samples of the same composition and grown in the same manner as the sample of Example 1 were irradiated for different doses as shown in Table 10. FIG. 7 shows the absorption spectra for each example, with curves A, B, C, D, E corresponding to Examples 10, 11, 12, 13, 14, 15 respectively.

TABLE 10

| Example Number | Dose 4.5 MeV, 20 mA (e⁻/cm²) | $V^0$ concentration (ppm) | $V^-$ concentration (ppm) | Comment |
|---|---|---|---|---|
| 9 | $1.3 \times 10^{15}$ | 0.0027 | 0.0005 | No visible color |
| 10 | $8.2 \times 10^{15}$ | 0.0072 | 0.003 | No visible color |
| 11 | $3.7 \times 10^{16}$ | 0.029 | 0.012 | No visible color |
| 12 | $6.5 \times 10^{16}$ | 0.050 | 0.014 | No visible color |
| 13 | $1.3 \times 10^{17}$ | 0.10 | 0.022 | No visible color |
| 14 | $2.6 \times 10^{17}$ | 0.17 | 0.033 | Pale blue - dose too high |
| 15 | $1.95 \times 10^{18}$ | 0.85 | 0.20 | Vivid blue - green |

From table 10 and FIG. 7 it can be seen that while a dose as small as $1.3 \times 10^{15}$ electrons/cm² is enough to stabilize the color, if the dose is too high (e.g. when it was $2.6 \times 10^{17}$ electrons/cm²) the concentration of irradiation damage defects is sufficient to introduce its own added absorption features. These absorption features are evident as a blue color (see table 10), and as the ND1 and GR1 peaks on the absorption spectra (FIG. 7) which are undesirable in near-colorless faceted stones for jewelry or in material tailored for a high power laser application requiring low absorption coefficient.

For easy comparison, the characteristics of examples that have different compositions or have been irradiated different amount (1, 3, 8 (comparative), and 9-15) are set out in Table 11 below.

TABLE 11

| Example | State | Characteristics | Color apparent to eye | Absorption coefficient of broad 270 nm peak indicative of $N_s^o$, cm⁻¹ | Proportion $N_s^o$ calculated from 270 nm peak, ppm |
|---|---|---|---|---|---|
| 1 | provided diamond material | N 0.7 ppm in process gas | colorless | 1.16 | 0.1 |
| 1 | provided and post UV | | | 1.46 | |
| 1 | provided and post thermal treatment 798 K for 1 hour | | | 0.92 | |
| 1 | Difference in absorption characteristic of provided diamond material after UV and thermal treatment | | | 1.46 − 0.92 = 0.54 | |
| 1 | Post irradiation | | colorless | 1.74 | |
| 1 | Post irradiation and UV | | | 1.70 | |
| 1 | Post irradiation and thermal treatment | | | 0.95 | |
| 1 | Difference in absorption characteristic of irradiated diamond material after UV/thermal treatment | | | 1.70 − 0.95 = 0.75 | |

| Example | Absorption coefficient at 350 nm | Absorption coefficient at 510 nm | C* | GIA grade | $V^o$ cm⁻³ | $V^-$ cm⁻³ | $NV^0$ cm⁻³ | $NV^-$ cm⁻³ |
|---|---|---|---|---|---|---|---|---|
| 1 | 0.78 | 0.30 | 3.72 | K | <5 × 10¹⁴ | <5 × 10¹⁴ | <5 × 10¹⁴ | <5 × 10¹⁴ |
| 1 | 0.87 | 0.34 | 4.37 | L | | | | |
| 1 | 0.62 | 0.18 | 2.97 | I | | | | |
| 1 | 0.87 − 0.62 = 0.25 | 0.34 − 0.18 = 0.16 | 4.37 − 2.97 = 1.4 | I to L = 4 grades | | | | |
| 1 | 1.19 | 0.39 | 3.99 | K | 5.13 × 10¹⁵ | 2.02 × 10¹⁵ | <5 × 10¹⁴ | <5 × 10¹⁴ |
| 1 | 1.13 | 0.36 | 3.96 | K | | | | |
| 1 | 1.26 | 0.37 | 3.32 | J | | | | |
| 1 | 1.26 − 1.13 = 0.13 | 0.37 − 0.36 = 0.01 | 0.67 | J to K = 2 grades | | | | |

| Example | State | Characteristics | Color apparent to eye | Absorption coefficient of broad 270 nm peak indicative of $N_s^o$, cm⁻¹ | Proportion $N_s^o$ calculated from 270 nm peak, ppm |
|---|---|---|---|---|---|
| 3 | Provided diamond material | 7 ppm $N_2$ equivalent in process gas | Dark brown | Not measured | 0.5 |
| 3 | provided and post UV | | | | 0.3 |
| 3 | provided and post thermal treatment 798 K for 1 hour | | | | 0.65 |

TABLE 11-continued

| | |
|---|---|
| 3 | Difference in absorption characteristic of provided diamond material after UV and after thermal treatment |
| 3 | Post irradiation |
| 3 | Post irradiation and UV |
| 3 | Post irradiation and thermal treatment |
| 3 | Difference in absorption characteristic of irradiated diamond material after UV and thermal treatment (predicted value) |

Light brown (Post irradiation); Not measured

| Example | Absorption coefficient at 350 nm in cm$^{-1}$ | Absorption coefficient at 510 nm in cm$^{-1}$ | C* | GIA grade | V cm$^{-3}$ | V$^-$ cm$^{-3}$ | NV$^0$ cm$^{-3}$ | NV$^-$ cm$^{-3}$ |
|---|---|---|---|---|---|---|---|---|
| 3 | 0.4 | 0.3 | 4.85 | Not measured | | | | |
| 3 | 0.2 | 0.1 | 5.43 | | | | | |
| 3 | 0.5 | 0.3 | 1.64 | | | | | |
| 3 | 0.5 − 0.2 = 0.3 | 0.3 − 0.1 = 0.2 | 3.79 | | | | | |
| 3 | Not measured | | Not measured | | | | | |
| 3 | | | | | | | | |
| 3 | | | 0.75 | | | | | |

| Example | State | Characteristics | Color apparent to eye | Absorption coefficient of broad 270 nm peak indicative of N$_s^o$ cm$^{-1}$ | Proportion N$_s^o$ calculated from 270 nm peak ppm |
|---|---|---|---|---|---|
| 8* | Provided | 92 ppb N$_2$ equivalent in process gas | colorless | Not measured | 0.01 |
| 8* | Provided post UV | | | | |
| 8* | Provided post thermal treatment | | | | |
| 8* | Difference in absorption characteristic after UV/thermal treatment | | | | |
| 8* | Irradiated sample | | Not tested - no color change to stabilize | | |
| 9 | As example 1, but irradiated 4.5 MeV, 20 mA for dose specified in characteristics column (e$^-$/cm$^2$) | 1.3 × 10$^{15}$ | colorless | Not measured | |
| 10 | | 8.2 × 10$^{15}$ | | | |
| 11 | | 3.7 × 10$^{16}$ | | | |
| 12 | | 6.5 × 10$^{16}$ | | | |
| 13 | | 1.3 × 10$^{17}$ | | | |
| 14 | | 2.6 × 10$^{17}$ | Pale blue | | |
| 15 | | 1.95 × 10$^{18}$ | Vivid blue/green | | |

| Example | Absorption coefficient at 350 nm | Absorption coefficient at 510 nm | C* | GIA grade | V$^0$ ppm | V$^-$ ppm | NV$^0$ cm-3 | NV$^-$ cm$^{-3}$ |
|---|---|---|---|---|---|---|---|---|
| 8* | Not measured | | 0.59 | E | Not measured | | | |
| 8* | | | 0.57 | E | | | | |
| 8* | | | 0.72 | E | | | | |
| 8* | | | 0.72 − 0.57 = 0.05 | No change | | | | |
| 8* | Not tested - no color change to stabilize | | | | | | | |
| 9 | Not measured | | | | 0.0027 | 0.0005 | Not measured | |
| 10 | | | | | 0.0072 | 0.003 | | |
| 11 | | | | | 0.029 | 0.12 | | |
| 12 | | | | | 0.050 | 0.14 | | |
| 13 | | | | | 0.1 | 0.022 | | |
| 14 | | | | | 0.17 | 0.033 | | |
| 15 | | | | | 0.85 | 0.2 | | |

*Example 8 is a comparative example

The invention claimed is:
1. Diamond material which has an absorption spectrum with one or both of the following characteristics:

| Designation | Peak | Absorption coefficient (at peak) |
|---|---|---|
| V⁰ | 741 nm | 0.01 cm⁻¹-1 cm⁻¹ (at 77 K) |
| V⁻ | 394 nm | 0.01 cm⁻¹-0.5 cm⁻¹ (at 77 K) | wherein the diamond material is a synthetic CVD diamond material and which has an absorption spectrum with the following additional characteristics:
(i)

| Designation | Starts | Ends | Peak | Absorption coefficient (at peak) |
|---|---|---|---|---|
| 270 nm | 220 nm | 325 nm | 270 nm | 0.05 cm⁻¹-20 cm⁻¹ | and
(ii) one or more of

| Designation | Starts | Ends | Peak | Absorption coefficient (at peak) |
|---|---|---|---|---|
| 350 nm band | 270 nm | 450 nm | 350 nm ± 10 nm | 0.05 cm⁻¹-10 cm⁻¹ |
| 510 nm band | 420 nm | 640 nm | 510 nm ± 50 nm | 0.02 cm⁻¹-10 cm⁻¹ |

| Designation | Form of Curve | Absorption Coefficient |
|---|---|---|
| Ramp | Rising background of form Absorption coefficient (cm⁻¹) = C × λ⁻³ (C = constant, λ in μm). | Contribution at 510 nm is: <1.5 cm⁻¹ |

2. Diamond material according to claim 1, which has an absorption coefficient at 570 nm that is less than 0.04 cm⁻¹.

3. Diamond material according to claim 1, which has a photoluminescence spectrum in its equilibrium state showing one or more of the following features:

| Wavelength (nm) | Raman normalized intensity |
|---|---|
| 512.6 | 0.095 |
| 526.4 | 0.001 |
| 486.2 | 0.01. |

4. Diamond material according to claim 1, which is a single crystal.

5. Diamond material according to claim 4, wherein the single crystal is in the form of a gemstone.

6. A method of preparing the diamond material of claim 1, the method comprising:
a) providing a nitrogen-containing diamond material which shows a measurable difference in at least one of its absorption characteristics in first and second states, the first state being after exposure to radiation having an energy of at least 5.5 eV, and the second state being after thermal treatment at 798 K (525° C.),
b) treating the said nitrogen containing diamond material by controlled irradiation of the said nitrogen-containing diamond material so as to introduce sufficient defects in the diamond material so as to produce one or both of:

(i) an absorption coefficient measured at 77 K of at least 0.01 cm⁻¹ and at most 1 cm⁻¹ at a wavelength of 741 nm; and
(ii) an absorption coefficient measured at 77 K of at least 0.01 cm⁻¹ and at most 0.5 cm⁻¹ at a wavelength of 394 nm;

whereby the measurable difference in the said absorption characteristics of the irradiation treated diamond material in the said first and second states, having been exposed to the same radiation and thermal treatment as the provided diamond, is reduced relative to the measurable difference in the said absorption characteristics of the provided diamond material in the said first and second states, and wherein the irradiation treated diamond material is the diamond material according to claim 1.

7. A method according to claim 6, wherein the measurable difference in the absorption characteristics of the treated diamond material in its first and second state, and the reduction in said measurable difference after the irradiation treatment are visible colour changes.

8. A method according to claim 6, wherein:
(a) the absorption spectrum of the provided diamond material in one or both of its first and second states has (i) an absorption coefficient of at least 0.05 cm⁻¹ at 270 nm, and one or both of (ii) an absorption coefficient of at least 0.05 cm⁻¹ at 350 nm and (iii) an absorption coefficient of at least 0.02 cm⁻¹ at 510 nm;
(b) the measurable difference in the absorption characteristics of the provided diamond material in its first and second states is a difference in the absorption coefficient at one or both of 350 nm and 510 nm is at least 0.15 cm⁻¹; and
(c) the controlled irradiation treatment step reduces the said difference between the absorption coefficients in the first and second states at one or both of 350 nm and 510 nm by at least 0.05 cm⁻¹.

9. A method according to claim 6, wherein the measurable difference in the absorption characteristics of the provided diamond material in its first and second states is a difference in the colour grade saturation value C* of the provided diamond material in its first and second states of at least 1, which difference in colour saturation value C* is reduced by at least 0.5 by the controlled irradiation step.

10. A method according to claim 9, wherein the C* value of the irradiated diamond material in its equilibrium condition is numerically lower than the C* value of the provided diamond material in its equilibrium condition.

11. A method according to claim 6, wherein the measurable difference in the absorption characteristics of the provided diamond material in its first and second states is a difference of at least two colour grades as measured on the GIA scale in the form of an equivalent 0.5 ct RBC stone, which difference in colour grade is reduced by at least one grade as measured on the GIA scale by the controlled irradiation step.

12. A method according to claim 11, wherein the colour grade of the irradiated diamond material in its equilibrium condition is the same colour grade or higher than the colour grade of the provided diamond material in its equilibrium condition.

13. A method according to claim 6, wherein the irradiated diamond material has an absorption coefficient at 570 nm that is less than 0.01 cm⁻¹.

14. A method according to claim 6, wherein the irradiation is provided by one or more of electrons, neutrons or gamma photons.

15. A method according to claim 14, wherein the irradiation provides an electron fluence in the range $1\times10^{15}$ to $2\times10^{17}$ electrons/cm$^2$.

16. A method according to claim 6, wherein the diamond material is a single crystal.

17. A method according to claim 16, wherein the single crystal is in the form of a gemstone.

\* \* \* \* \*